(12) United States Patent
Hurst, Jr. et al.

(10) Patent No.: US 6,798,729 B1
(45) Date of Patent: Sep. 28, 2004

(54) OPTICAL HEAD USING MICRO-MACHINED ELEMENTS

(75) Inventors: Jerry E. Hurst, Jr., San Jose, CA (US); Joseph Drake, Mountain View, CA (US); Jeffrey P. Wilde, Los Gatos, CA (US); Joseph E. Davis, Morgan Hill, CA (US); John F. Heanue, Fremont, CA (US); Kurt E. Petersen, San Jose, CA (US); Terry McDaniel, Morgan Hill, CA (US); Jeff Drazan, Atherton, CA (US)

(73) Assignee: Seagate Technology LLC, Scotts Valley, CA (US)

(*) Notice: Subject to any disclaimer, the term of this patent is extended or adjusted under 35 U.S.C. 154(b) by 693 days.

(21) Appl. No.: 09/271,440

(22) Filed: Mar. 18, 1999

Related U.S. Application Data

(62) Division of application No. 08/823,422, filed on Mar. 24, 1997, now abandoned.
(60) Provisional application No. 60/022,775, filed on Jul. 30, 1996, provisional application No. 60/023,476, filed on Aug. 6, 1996, and provisional application No. 60/025,801, filed on Aug. 27, 1996.

(51) Int. Cl.[7] .................................................. G11B 7/00
(52) U.S. Cl. ..................................... 369/119; 369/44.19
(58) Field of Search ................................. 369/112, 110, 369/44.19, 109, 121, 44.23, 44.24, 44.12, 119, 118

(56) References Cited

U.S. PATENT DOCUMENTS

| | | |
|---|---|---|
| 3,737,236 A | 6/1973 | Borrelli |
| 4,003,059 A | 1/1977 | Sugiura et al. |
| 4,175,832 A | 11/1979 | Umeki |
| 4,581,529 A | 4/1986 | Gordon |
| 4,740,951 A | 4/1988 | Lizet |
| 4,799,210 A | 1/1989 | Wilson |
| 4,945,400 A | 7/1990 | Blonder et al. |
| 5,033,043 A | 7/1991 | Hayakawa |
| 5,105,408 A | 4/1992 | Lee |
| 5,119,361 A | 6/1992 | Tanabe |
| 5,152,597 A | 10/1992 | Barnard |
| 5,153,870 A | 10/1992 | Lee |
| 5,197,050 A | 3/1993 | Murakami |
| 5,199,090 A | 3/1993 | Bell |
| 5,212,582 A | 5/1993 | Nelson |
| 5,218,582 A | 6/1993 | Marchant |
| 5,233,587 A | 8/1993 | Asano |

(List continued on next page.)

FOREIGN PATENT DOCUMENTS

| | | |
|---|---|---|
| EP | 0331331 A2 | 9/1989 |
| EP | 0 460 890 A2 | 3/1991 |
| EP | 0 419 853 A2 | 4/1991 |

(List continued on next page.)

OTHER PUBLICATIONS

Linder, et al. "Photolithography in Anisotropically Etched Grooves" IEEE 95th Annual Int. workshop on Micro Electro Mechanical Systems Feb. 11–15, 1996 pp 38–43.

(List continued on next page.)

*Primary Examiner*—Nabil Hindi
(74) *Attorney, Agent, or Firm*—Benjamin T. Queen, II, Esq.; Pietragallo, Bosick & Gordon

(57) ABSTRACT

An optical head utilizes a micro-machined element in combination with a light source and a lens to write and read data onto a storage disk. The micro-machined element may include a steerable micro-machined mirror or a micro-actuator. A beam of laser light transmitted from the light source to the optical head and a reflected light from the storage disk is altered by a movement of the micro-machined element. In this manner a focused optical spot is scanned back and forth in a direction which is approximately parallel to the radial direction of the storage disk.

32 Claims, 28 Drawing Sheets

U.S. PATENT DOCUMENTS

| | | |
|---|---|---|
| 5,243,241 A | 9/1993 | Wang |
| 5,245,491 A | 9/1993 | Horie |
| 5,253,245 A | 10/1993 | Rabedeau |
| 5,255,260 A | 10/1993 | Yamada |
| 5,295,122 A | 3/1994 | Murakami |
| 5,296,988 A | 3/1994 | Fujino |
| 5,313,442 A | 5/1994 | Ohtsuka |
| 5,325,116 A | 6/1994 | Sampsell |
| 5,327,416 A | 7/1994 | Lee |
| 5,331,454 A | 7/1994 | Hornbeck |
| 5,351,229 A | 9/1994 | Brezoczky |
| 5,432,763 A | 7/1995 | Campbell |
| 5,444,566 A | 8/1995 | Gale |
| 5,481,386 A | 1/1996 | Shimano |
| 5,504,731 A | 4/1996 | Lee |
| 5,519,677 A | 5/1996 | Shibata |
| 5,536,926 A | 7/1996 | Ikeda et al. |
| 5,563,871 A | 10/1996 | Bargenhuff et al. |
| 5,625,483 A | 4/1997 | Swartz |
| 5,737,302 A | 4/1998 | Kasahara |
| 5,742,419 A | 4/1998 | Dickensheets et al. |

FOREIGN PATENT DOCUMENTS

| | | | |
|---|---|---|---|
| EP | 0 460 889 A2 | 6/1991 | |
| EP | 0 469 293 A1 | 2/1992 | |
| EP | 0 539 889 A2 | 5/1993 | |
| EP | 0 588 344 A2 | 9/1993 | |
| EP | 0614101 A2 | 9/1994 | |
| EP | 0 715 302 A1 | 12/1994 | |
| EP | 0650133 A2 | 4/1995 | |
| EP | 0 664 470 A2 | 7/1995 | |
| EP | 0 712 121 A2 | 5/1996 | |
| GB | 2016744 | 9/1979 | |
| GB | 2016744 A | 6/1984 | |
| JP | 59-117180 | 6/1984 | |
| JP | 62-222455 | * 9/1987 | 369/44.14 |
| JP | 6-150362 | * 5/1994 | 369/44.14 |
| WO | PCT/GB94/01984 | 9/1994 | |
| WO | WO 95/07184 | 9/1994 | |
| WO | WO 95/13638 | 5/1995 | |
| WO | PCT/US95/12018 | 9/1995 | |

OTHER PUBLICATIONS

Barnes, et al. "Use of Optical Fiber Heads for Optical Disks" Applied Optics vol. 25 No. 22 11/86 pp 4010–4012.

Suhara, "integrated–Optic Disk Pickup Devices: Hybrid to Monolithic Integration" Int. Symposium on Optical Memory & Optical Data Storage 7/96 pp 284–286.

Jerman, "Recent Trends in Silicon Micromachining Technology" SPIE vol. 2639 1995 pp 3–8.

Dickensheets, et al. "Micromachined Scanning Confocal Optical Microscope" Optics Letters vol. 21 No. 10 5/96 pp 764–766.

Howe, "Polysilicon Integrated Microsystems: Technologies and Applications" 8th Int. Conference on Solid State Sensors and Actuators 6/95 pp 43–46.

Renard et al. "Magneto Optical Reading and Writing Integrated Heads: A Way to a Multigigabyte Multi–Rigid–Disk Drive" SPIE Vo.. 1499 1991 pp 238–246.

Opsasnick, et al. "Optical Fibers for Magneto–Optical Recording" SPIE vol. 1499 1991 pp 238–246.

Coughlin, et al. "Design Trends in Head/Gimbal Assemblies for Hard–Disk Drives" data Storage 5/95/ pp 23–31.

Petersen, "Silicon Torsional Scanning Mirror" IBM J. Res. Dev. vol. 24, No. 5 9/80 pp 631–637.

Petersen, Silicon as a Mechanical Material: Proceedings of the IEEE vol. 70 No. 5 5/82 pp 420–457.

R. Boysel, T. McDonald, G. Magel, G. Smith, J. Leonard, "Integration of Deformable Mirror Devices with Optical Fibers and Waveguides", SPIE vol. 1793, Integrated Optics and Microstructures (1992), pp 34–39.

M. Daneman, O. Solgaard, N. Tien, K. Lau, R. Muller, "Laser–to–Fiber Coupling Module Using Micromachined Alignment Mirror", IEEE Photonics Technology Letters, vol. 8, No. 3, Mar. 1996 pp. 396–398.

* cited by examiner

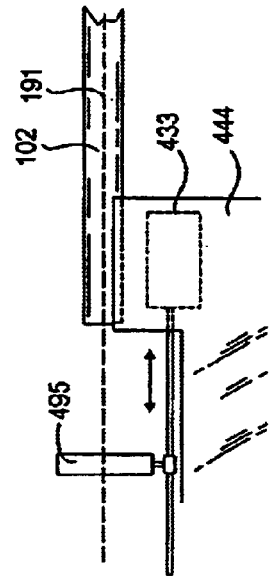
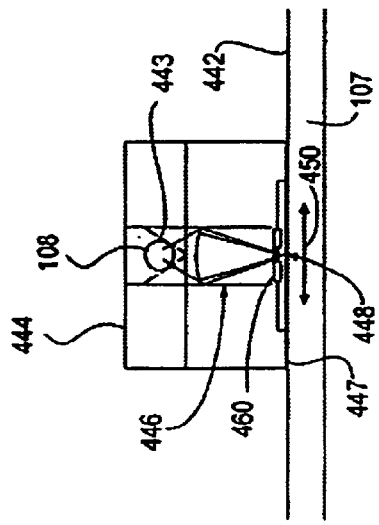
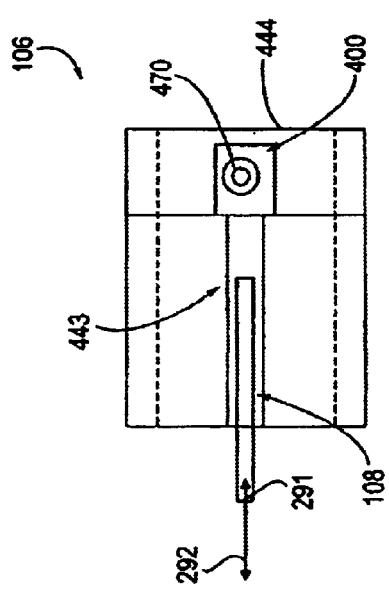
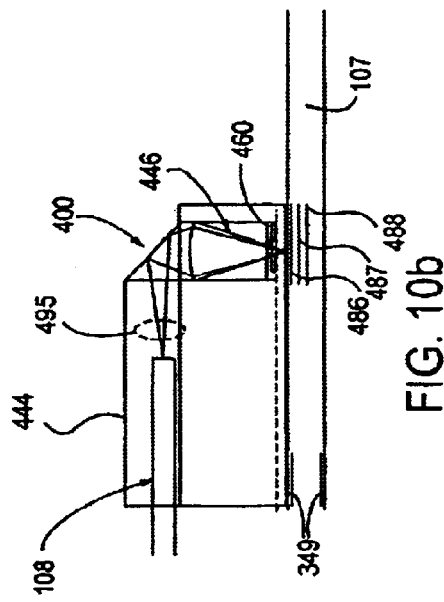
FIG. 10a
FIG. 10b
FIG. 10c
FIG. 10d

The materials, refractive indices, and layer thicknesses for the multilayer stack consisting of 12 layers.

| Layer | Material | n | k | Optical Thickness (nd/λ) | Thickness (d: nm) at λ=680nm |
|---|---|---|---|---|---|
| Incident Medium | Air | 1.0 | 0 | | |
| 1 | ZnS | 2.2948 | 0 | 0.43141 | 127.8 |
| 2 | SiO2 | 1.463041 | 0 | 0.34026 | 158.1 |
| 3 | ZnS | 2.2948 | 0 | 0.32126 | 95.2 |
| 4 | SiO2 | 1.463041 | 0 | 0.26916 | 125.1 |
| 5 | ZnS | 2.2948 | 0 | 0.30591 | 90.6 |
| 6 | SiO2 | 1.463041 | 0 | 0.30298 | 140.8 |
| 7 | ZnS | 2.2948 | 0 | 0.33003 | 97.8 |
| 8 | SiO2 | 1.463041 | 0 | 0.30665 | 142.5 |
| 9 | ZnS | 2.2948 | 0 | 0.31543 | 93.5 |
| 10 | SiO2 | 1.463041 | 0 | 0.31801 | 147.8 |
| 11 | ZnS | 2.2948 | 0 | 0.29563 | 87.6 |
| 12 | SiO2 | 1.463041 | 0 | 0.29544 | 137.3 |
| Substrate | Au | 0.1354 | 3.6548 | | |

FIG. 13

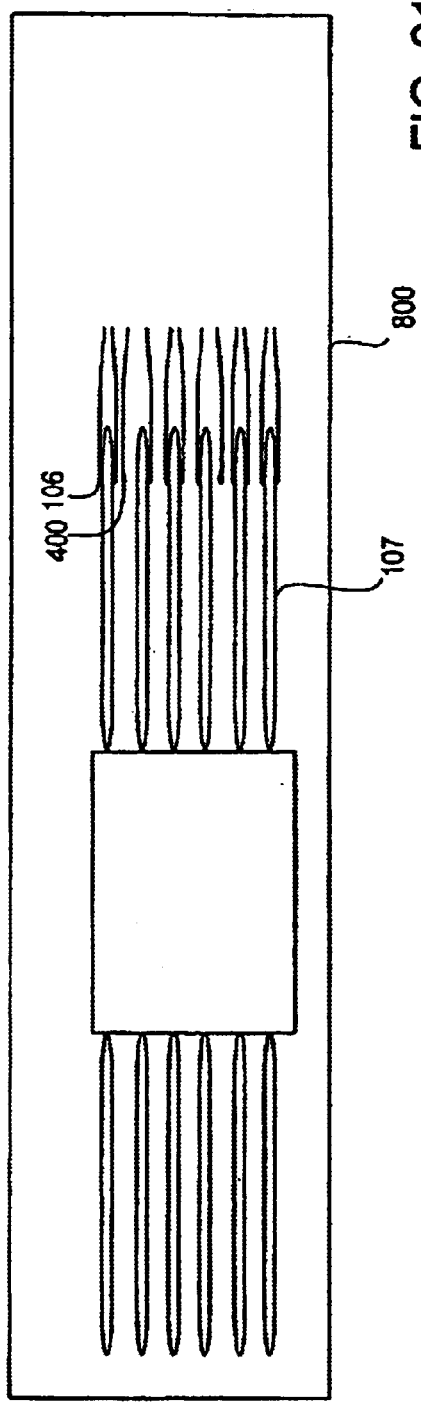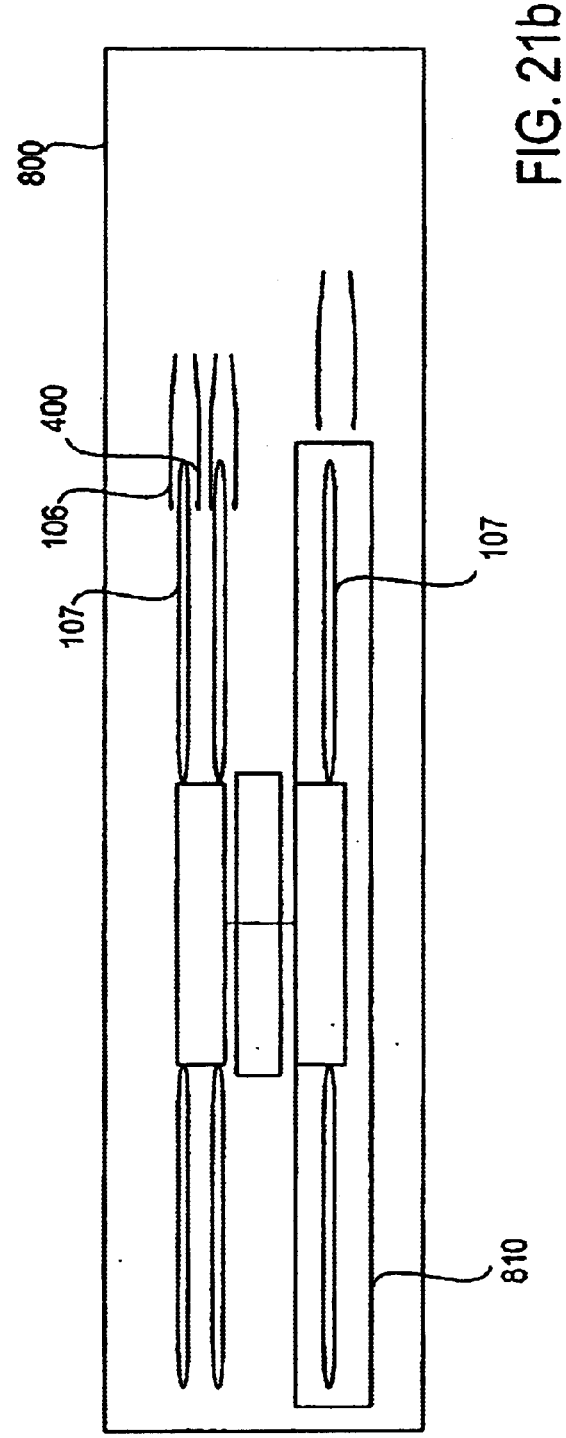

OPTICAL HEAD USING MICRO-MACHINED ELEMENTS

CROSS REFERENCE TO RELATED APPLICATIONS

This applications is a division of Ser. No. 08/823,422 filed Mar. 24, 1997, now abandoned, which claims benefit of: Provisional Application Serial No. 60/022,775, entitled "A Data Storage And Retrieval System Based on Flying Magneto-Optical Head," filed on Jul. 30, 1996; Provisional Application Serial No. 60/023,476, entitled "A Data Storage And Retrieval System Based on A Flying Magneto-Optical Head," filed on Aug. 6, 1996; and Provisional Application Serial No. 60/025,801, entitled "A Data Storage And Retrieval System Based on A Flying Magneto-Optical Head," filed on Aug. 27, 1996. The subject matter of each of these related applications is incorporated herein by reference. All related applications are commonly assigned.

BACKGROUND OF THE INVENTION

1. Field of the Invention

The present invention relates generally to optical data storage systems. More particularly, the present invention relates to the use of micro-machined elements in optical data storage systems.

2. Background Art

In a magneto-optical storage system, using a magneto-optical (MO) recording material deposited on a rotating disk, information may be recorded on the disk as spatial variations of magnetic domains. During readout, a magnetic domain pattern modulates an optical polarization, and a detection system converts a resulting signal from optical to electronic format.

In one type of a magneto-optical storage system, a magneto-optical head assembly is located on a linear actuator that moves the head along a radial direction of the disk to position the optical head assembly over data tracks during recording and readout. A magnetic coil is placed on a separate assembly on the head assembly to create a magnetic field that has a magnetic component in a direction perpendicular to the disk surface. A vertical magnetization of polarity, opposite to that of the surrounding magnetic material of the disk medium is recorded as a mark indicating zero or a one by first focusing a beam of laser light to form an optical spot on the disk. The optical spot functions to heat the magneto optical material to a temperature near or above a Curie point (a temperature at which the magnetization may be readily altered with an applied magnetic field). A current passed through the magnetic coil orients the spontaneous vertical magnetization either up or down. This orientation process occurs in the region of the optical spot where the temperature is suitably high. The orientation of the magnetization mark is preserved after the laser beam is removed. The mark is erased or overwritten if it is locally reheated to the Curie point by the laser beam during a time the magnetic coil creates a magnetic field in the opposite direction.

Information is read back from a particular mark on the disk by taking advantage of the magnetic Kerr effect so as to detect a Kerr rotation of the optical polarization that is imposed on a reflected beam by the magnetization at the mark of interest. The magnitude of the Kerr rotation is determined by the material's properties (embodied in the Kerr coefficient). The sense of the rotation is measured by established differential detection schemes and, depending on the direction of the spontaneous magnetization at the mark of interest, is oriented clockwise or counter-clockwise.

Conventional magneto-optical heads, while presently providing access to magneto-optical disks with areal densities on the order of 1 Gigabit/in$^2$, tend to be based on relatively large optical assemblies which make the physical size and mass of the head rather bulky (typically 3–15 mm in a dimension). Consequently, the speed at which prior art magneto-optical heads are mechanically moved to access new data tracks on a magneto-optical storage disk is slow. Additionally, the physical size of the prior art magneto-optical heads limits the spacing between magneto-optical disks. Because the volume available in standard height disk drives is limited, magneto-optical disk drives have, thus, not been available as high capacity commercial products. For example, a commercial magneto-optical storage device presently available provides access to only one side of a 130 mm double sided 2.6 ISO gigabyte magneto-optical disk, a 40 ms disk access time, and a data transfer rate of 4.6 MB/Sec.

N. Yamada (U.S. Pat. No. 5,255,260) discloses a low-profile flying optical head for accessing an upper and lower surface of a plurality of optical disks. The flying optical head disclosed by Yamada describes an actuating arm that has a static (fixed relative to the arm) mirror or prism mounted thereon, for delivering light to and receiving light from a phase-change optical disk. While the static optics described by Yamada provides access to both surfaces of a plurality of phase-change optical disks contained within a fixed volume, Yamada is limited by how small the optics can be made. Consequently, the number of optical disks that can be manufactured to function within a given volume is also limited. Another shortcoming relates to the use of static optics. This approach imposes a limit on track servo bandwidth by requiring the entire optical head assembly to move in order to change the location of a focused optical spot. This same limitation applies to the flying magneto-optical head disclosed by Murakami et al. in U.S. Pat. No. 5,197,050. In general, the larger the mass of the element used to perform fine track servoing, the lower the servo bandwidth becomes and the lower the track density that can be read or written.

A method for moving a folding prism or mirror with a galvanometer actuator for fine tracking has been disclosed by C. Wang in U.S. Pat. No. 5,243,241. The galvanometer consists of bulky wire coils and a rotatable magnet mounted on a linear actuator arm attached to a flying magneto-optical head, but not mounted on the slider body itself. This design limits the tracking servo bandwidth and achievable track density due to its size and weight. Its complexity also increases the cost and difficulty of manufacture.

What is needed is an improved optical head that is compact and that allows an increase in the number of disks that can be placed within a given volume as compared to the prior art. The improved optical head should preferably provide a high numerical aperture, a reduced head size and mass, and a high resonance frequency tracking servo device that provides a very fine track servo bandwidth. Additionally, the optical head should improve upon prior art access to disk surfaces, disk drive access times, data transfer rates, and ease of alignment and manufacture.

SUMMARY OF THE INVENTION

The present invention provides improvements over prior art optical disk drives. The improvements allow an increase in the number of storage disks that can be placed within any given volume. The improvements enable the use of a high resonance frequency tracking servo device on a reduced profile head to provide improved access to storage media, improved disk drive access times, and improved data transfer rates.

The optical disk of the present invention utilizes Winchester magnetic disk technology. A laser optics assembly couples an optical light source through a small micro-machined optical switch to one or more rotary arms, each of which support an optical head for writing and reading data to the storage media. Lighting is delivered through an optical fiber to a respective optical head for the purpose of probing the storage media with a focused optical spot. The reflected light signal from the storage media then couples back through the optical head for processing.

The light transmitted from the optical fiber to the optical head is affected by a micro-machined element. In the preferred embodiment, the light is affected by a steerable micro-machined mirror. Track following and seeks to adjacent tracks are performed by rotating a central mirror portion of the steerable micro-machined mirror about an axis of rotation. A reflected light from the steerable micro-machined mirror is directed through an embedded micro-objective lens such as a GRIN (Graded Index) lens or a molded lens. A focused optical spot is scanned back and forth in a direction which is approximately parallel to the radial direction of the storage media. In a second preferred embodiment, track following and seeks to adjacent tracks may be performed with more than one storage media at a time by operating a set of steerable micro-machined mirrors independently from each other.

The steerable micro-machined mirror includes a flexure layer having a structure defining an opening. A central mirror portion is disposed in the opening. The central mirror portion includes a parallelogrammatic reflective structure that includes a pair of first opposed sides and a pair of second opposed sides, with the pair of flexure layer hinges being integrally bound to the pair of the first opposed sides and to the flexure layer. In another preferred embodiment, at least one tether member may be integrally bound to the second opposed sides of the central mirror portion and to the flexure layer. The at least one tether member includes a structure defining at least one tether channel. The tether functions for limiting a range of movement of the mirror and for preventing the mirror from contacting an actuation electrode. In another preferred embodiment, the steerable micro-machined mirror includes: a substrate, at least one actuation electrode supported by the substrate, and at least one plate member supported by the at least one actuation electrode. The actuation electrode may include a first electrode surface, and a second electrode surface which is generally parallel to the first electrode surface and at a different elevation than the first electrode surface.

In a preferred embodiment, the steerable micro-machined mirror is attached to a flying magneto-optical head. The flying magneto-optical head is preferably one of a set of magneto-optical heads for use in a magneto-optical system.

BRIEF DESCRIPTION OF THE DRAWINGS

FIGS. 10-a–d are respective diagrams showing a top view, a side view, a front view and a side view, of a magneto-optical head;

FIG. 13 illustrates the thickness and composition of the quarter-wave plate of FIG. 12;

FIGS. 21a–b are cross-sectional diagrams showing a magneto-optical data storage and retrieval system as part of a magneto-optical disk drive;

DESCRIPTION OF THE INVENTION

Figure 1:
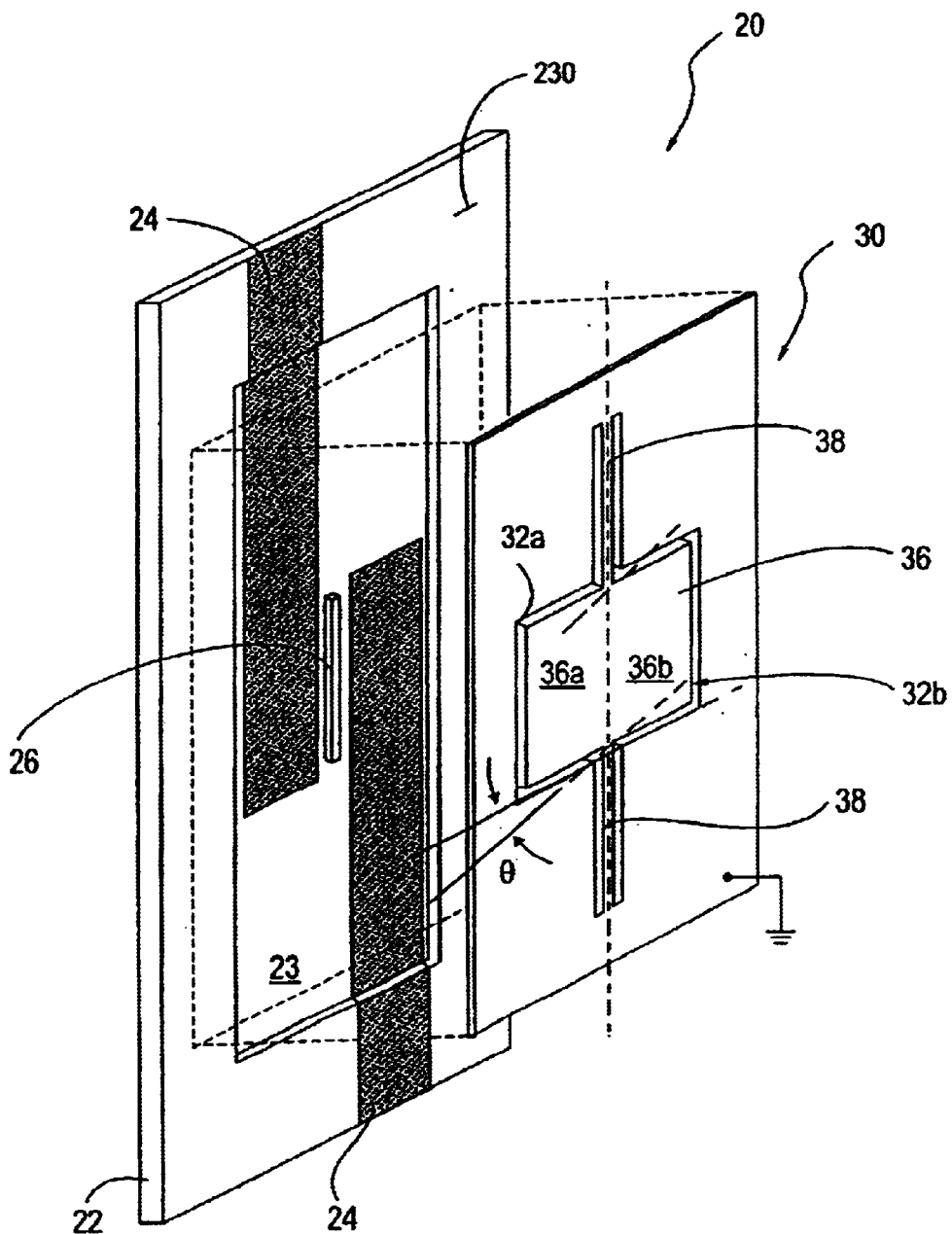
FIG. 1 is an exploded view of a prior art silicon torsion mirror structure.

Referring in detail now to the drawings wherein similar parts of the invention are identified by like reference numerals, there is seen in FIG. 1 a prior art steerable micro-machined torsional mirror assembly, generally illustrated as 20. The mirror assembly 20 includes a substrate 22 that comprises a peripheral rim 22a defining a recessed well 23. A pair of spaced apart and electrically isolated actuation electrodes 24 are disposed within the well 23.

A support ridge, generally illustrated as 26, is mounted on the substrate 22 and is disposed in the well 23 and is surrounded by the rim 22a. The ridge 26 is disposed between the pair of electrodes 24. A silicon nitride flexure layer 30 functions as an upper mirror support member and is supported by the support ridge 26 and surrounding frame 26a in a spaced relationship with respect to the pair of electrodes 24. The mirror support member 30 defines a pair of slotted apertures, generally illustrated as 32a,b. The apertures 32a,b are configured to define a portion of the flexure layer 30 as a planar mirror, generally illustrated as 36, and are suspended by a pair of axially aligned torsion hinge members (i.e., flexure layer hinges) 38 which mechanically interconnect or couple one pair of respective opposite edges of the mirror 36 to the mirror support member 30. The mirror 36 is configured symmetrically about the axially aligned hinges 38 to present symmetrically opposed halves 36a, 36b extending distally from the axially aligned hinges 38.

The actuation electrodes 24 are positioned such that a portion of each is aligned facing generally opposite to a respective half of the mirror 36. The actuation electrodes 24 are connected to an external power source. The actuation electrodes 24 receive current from the external power source to become oppositely charged in accordance with an applied actuation voltage. The actuation voltage is arranged to cause the mirror 36 to rotate about the axially aligned hinges 38 at an angle theta (θ) by electrostatic image charges induced by the oppositely charged electrodes 24.

Figure 2:
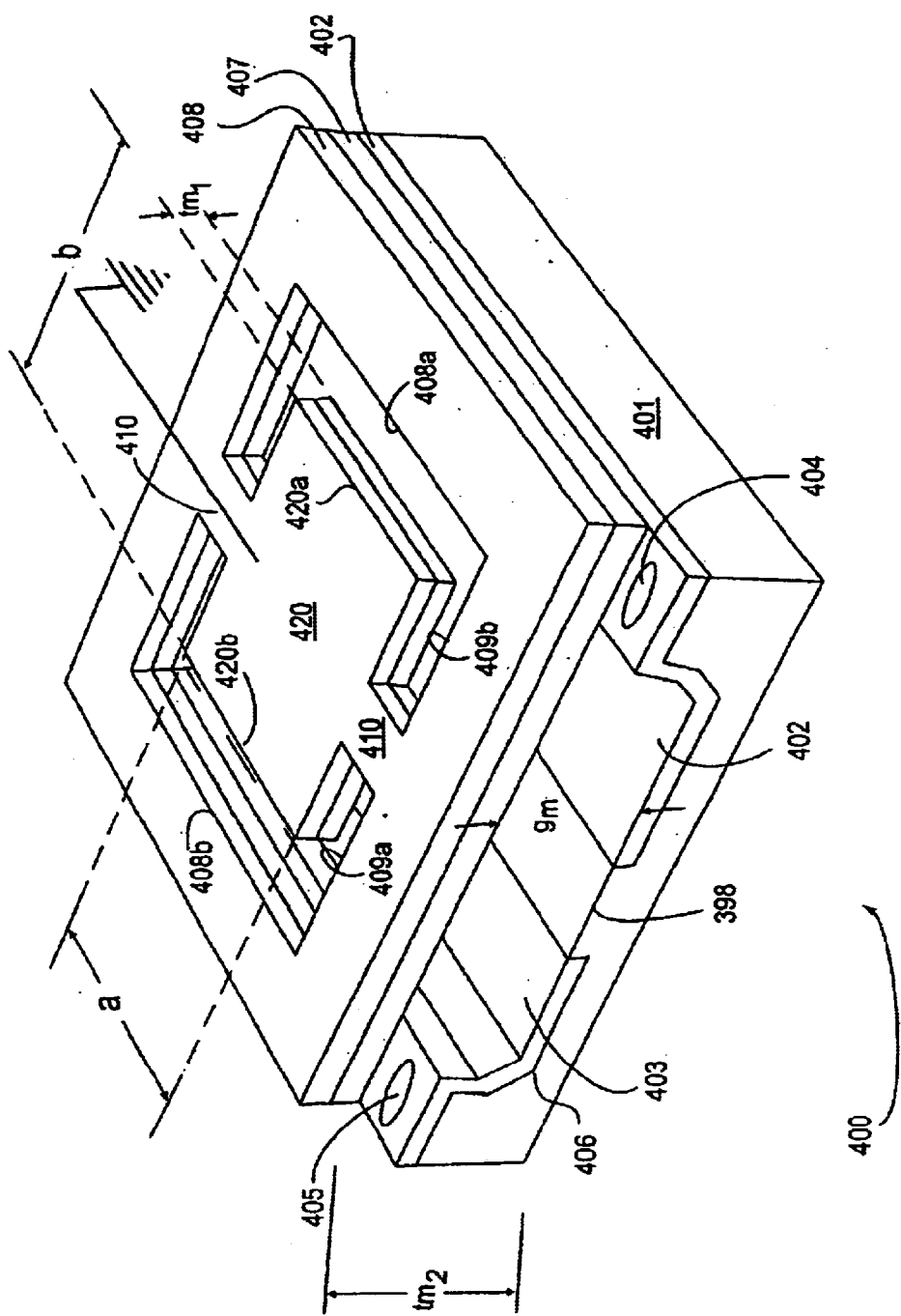
FIG. 2 is a perspective view of a steerable micro-machined mirror.

Referring now to FIG. 2, there is seen a preferred embodiment of a micro-machined mirror assembly 400 of the present invention. The steerable micro-machined mirror assembly 400 includes a silicon substrate 401 that has a recess 406 therein. A spaced apart pair of planar drive (actuation) electrodes broadly and generally illustrated as 402 and 403 are disposed along the bottom of the recess 406. A ridge 398 separates the drive electrodes 402 and 403. A planar silicon plate 407 is bonded to respective portions of the electrodes 402, 403. A planar flexure layer 408 made from a material such as silicon dioxide or silicon nitride is bonded to the outward face of the plate 407. Flexure layer 408 is formed comprise opposed annular portions 408a and 408b.

An outward facing reflective central mirror portion 420 is defined in a portion of the top flexure layer 408 and a respective portion of the inner silicon plate layer 407 by spaced apart opposing C-shaped aperture slots 409-a, 409-b formed there through. The reflective central mirror portion 420 is configured to provide integral opposed halves 420a and 420b. The opposed halves 420a and 420b are symmetrically disposed about and distally extending from an axis formed by a pair of axially aligned, opposed flexure layer hinges 410.

The flexure layer hinges 410 are integrally formed from the flexure layer 408 and provide torsional restoring torque to the reflective central mirror portion 420. The reflective central mirror portion 420 may be metalized with gold or a similar substance to increase the optical reflectivity and to improve electrostatic actuation of the reflective central mirror portion 420.

In an exemplary embodiment, the steerable micro-machined mirror assembly 400 operates over a bandwidth of approximately 50 to 200 KHz with an application to electrodes 402 and 403 of an actuation voltage of approximately 90 to 200 volts. The reflective central mirror portion 420 is a generally parallelogrammatic structure that includes: a linear dimension, a and b, that is approximately 300 microns or less; and a thickness, tm2, that is approximately 3 microns or less. The gap spacing between the bottom of the reflective central mirror portion 420 and the drive electrodes 402 and 403, gm, is approximately 10 microns or less. In the exemplary embodiment, an outside thickness of the steerable micro-machined mirror assembly 400, tm1, is approximately 200 microns or less. In the exemplary embodiment, the reflective central mirror portion 420 achieves a preferable physical angular rotation of at least ±2 degrees about a longitudinal axis defined by hinges 410. Preferably, the reflective central mirror portion 420 may be driven torsionally without any excessive transverse motion and should maintain an optical flatness of lambda/10 during static and/or upon dynamic operation. The maximum stress upon electrostatic deflection should be below the expected yield stress of the material used to construct the reflective central mirror portion 420. The aforementioned characteristics and dimensions of the steerable micro-machined mirror assembly 400 are meant to be exemplary in nature and should be limited by the scope of the ensuing claims only.

In an exemplary embodiment, the steerable micro-machined mirror assembly 400 may be fabricated by etching the recess 406 into the silicon substrate wafer 401. The silicon plate 407 may be oxide bonded to achieve electrical isolation from the electrodes 402, 403 and may be subsequently thinned and polished to a desired thickness. The flexure layer 408 may be deposited and patterned to define the periphery of the reflective central mirror portion 420 and the width of the hinge 410. An isotropic etch may be used to form the aperture slots 409-a, b around reflective central mirror portion 420 and beneath the flexure hinges 410, while leaving the silicon plate 407 under the reflective central mirror portion 420 to provide rigid support. The etch step may be used to provide access to electrodes 402 and 403 so that the bonding pads 404 and 405 may be formed by a deposition of metal to electrically and mechanically connect to the respective electrodes 402, 403. While the steerable micro-machined mirror assembly 400 has been described as being fabricated using bulk micro-machining techniques, surface micro-machining techniques may also be used, for example, surface micro-machining techniques as disclosed in "Design techniques for surface micro-machining MEMS processes," J. Comtois et al., 1991 SPIE Proceeding Series Volume 2639, pp. 211–222.

Referring now to Examples 1–3 below, exemplary analyses show that as the angular deflection of the reflective central mirror portion 420 increases, the reflective central mirror portion 420 may experience instability as electrostatic torque forces overwhelm a restoring torque provided by the torsional hinges. Use of the relatively wide gap of the prior art with a desired ±2 degrees of deflection of the reflective central mirror portion 420 of the present invention may require a relatively large actuation voltage to be applied to the electrodes 402 and 403. Additionally, use of a relatively wide gap between the reflective central mirror portion 420 and the electrodes 402 and 403 may result in a relatively non-linear relationship between the angular deflection of the reflective central mirror portion 420 and an applied voltage to the electrodes 402 and 403. Accordingly, the steerable micro-machined mirror assembly 400 is described in the following discussion to include modifications that change the operating characteristics of the steerable micromachined mirror assembly 400 including: a reduced gap width, improved linearity, decreased actuation voltage required for full scale angular deflection, and an increase in the range of angular deflection that can be achieved before the aforementioned instability occurs.

Figure 3:
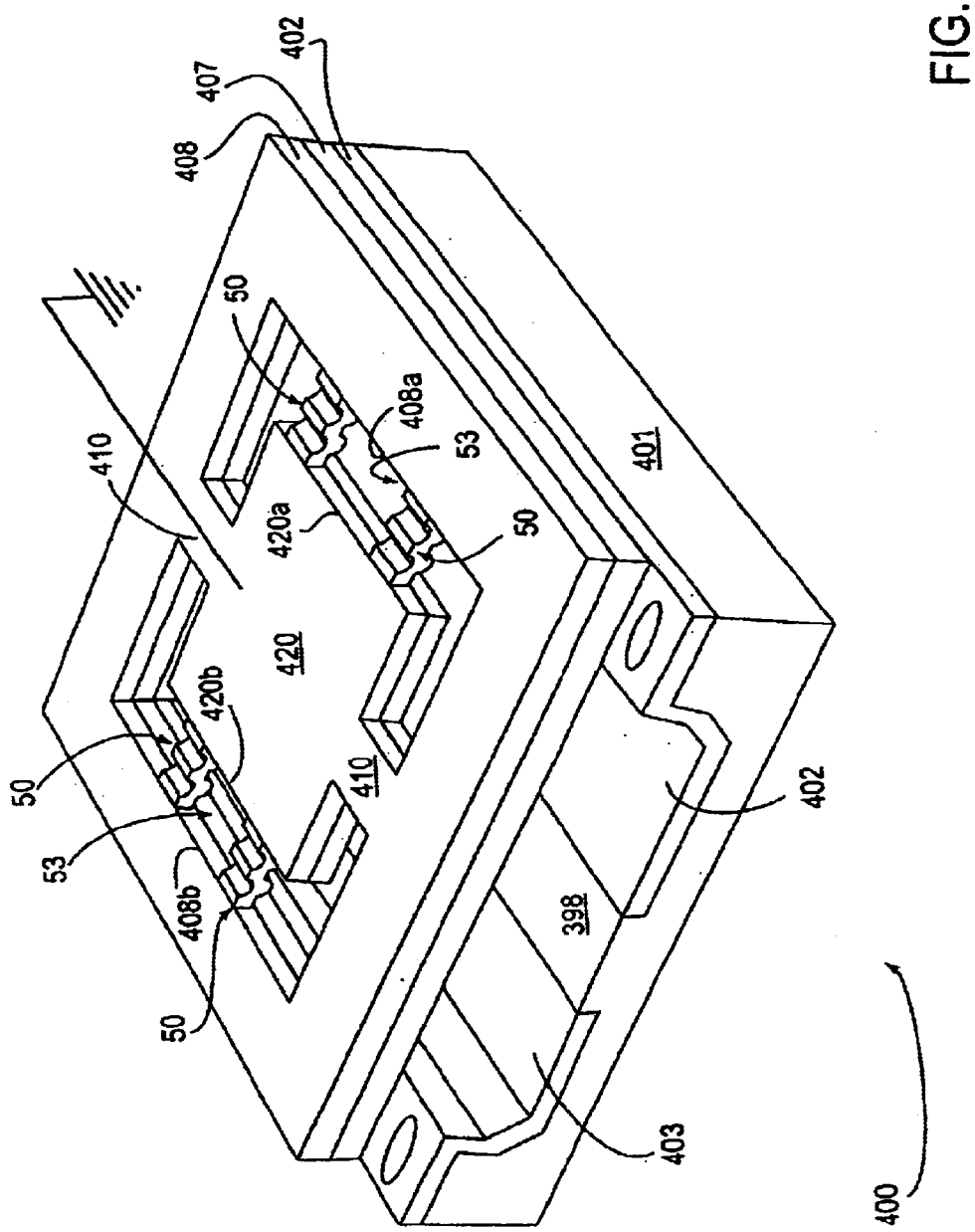
FIG. 3 is a perspective view of a steerable micro-machined mirror including a pair of tether members.
Figure 4:
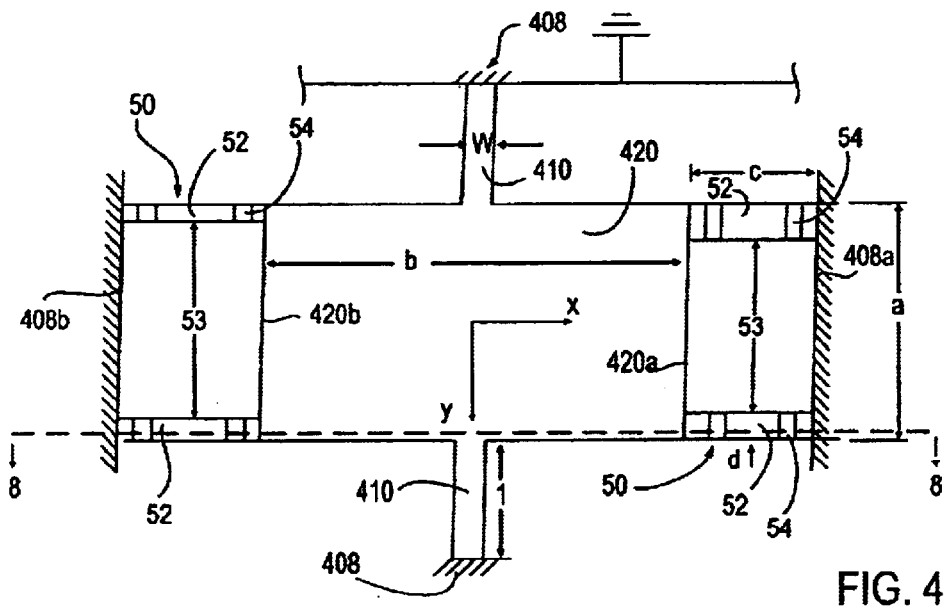
FIG. 4 is a top plan of the steerable micro-machined mirror of FIG. 3.
Figure 5:
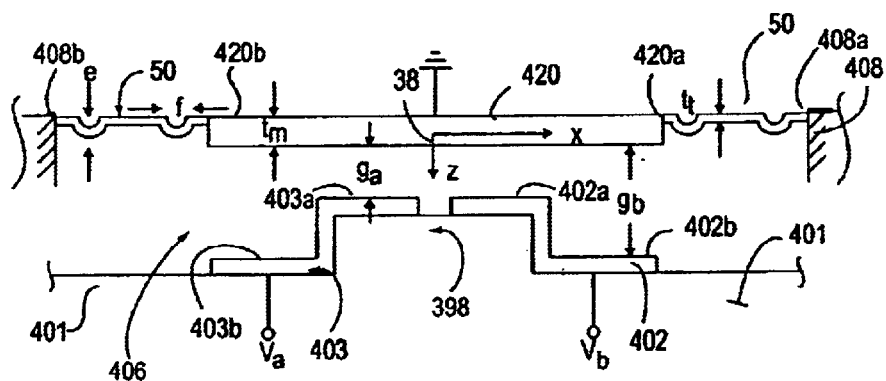
FIG. 5 is a vertical sectional view taken in direction of the arrows and along the plane of line 8—8 in FIG. 4.

Referring now to FIGS. 3, 4, and 5, the steerable micro-machined mirror assembly 400 may include at least one tether member 50 for further coupling the reflective central mirror portion 420 to the flexure layer 408. More specifically, the at least one tether member 50 respectively couples a respective at least one of the opposed annular portions 408a and 408b of the flexure layer 408 to the respective opposed halves 420a and 420b of the reflective central mirror portion 420.

Each tether member 50 may be a parallelogrammation structure 52 having at least one, preferably a pair of transverse channels 54. As shown in FIG. 3, distal edges of opposed halves 420a and 420b each have a pair of spaced apart tethers 52 secured thereto, separated by gap 53. The grooves or channels 54 may be plasma etched using a planar etch to define isotropically etched contours within a selected surface area of flexure layer 408. An etch stop may be diffused into the convoluted surface so that the etched contours follow the etch-stop layer. The flexure layer 408 portion that includes the tether member 50 may be patterned and etched from the surface opposed to that of channels 54, with the etch stop layers producing the desired corrugated cross-section. With conventional plasma etching techniques, etched groove depths may be produced from a fraction of a micrometer to about 50 micrometer. If boron etch stops are used, the available tether member 50 thickness may range from about 0.5 micrometer to about 10 micrometer. A similar range is available with diffused electrochemical etch stops, although the maximum thickness can be increased above 20 micrometer with sufficiently long diffusions.

The tether members 50 permit torsional motion of the reflective central mirror portion 420 about axially aligned flexure layer hinges 410, but limit transverse motion; that is, the tether member 50 limits movement of the distal edges of reflective central mirror portion 420 towards sides 408a and 408b of the flexure layer 408. The tether member 50 also provides a torsional restoring force (in addition to that provided by flexure layer hinges 410) to return the reflective central mirror portion 420 to an undeflected position. The tether member 50 also limits the reflective central mirror portion 420 from contacting the actuation electrodes 402 and 403 in a high drive situation, along with preventing contact deformation and warping of the reflective central mirror portion 420. The tether member 50 further prevents the reflective central mirror portion 420 from deflecting beyond a critical angle which would otherwise result in spontaneous deflection to one of the actuator electrodes 402 or 403.

Rotation or torsional movement of the reflective central mirror portion 420 causes the tether members 50 to deflect downwards (z-direction) while remaining attached to the sides 420a and 420b of the reflective central mirror portion 420. In order to remain attached, tether members 50 preferably stretch somewhat to accommodate the increased distance from the sides 420a and 420b of the reflective central mirror portion 420 to the sides 408a and 408b of the flexure layer 408.

Considering a single tether 50 acting as a beam and temporarily ignoring the presence of the grooves or channels 54 for small deflections, the amount of force required to deflect the beam in the z-direction is approximately linearly proportional to the a amount of deflection realized. For larger deflections, this relationship may be non-linear, with larger incremental amounts of force required to obtain incremental deflections. The non-linearity of the tether member 50 may be tailored to meet the non-linearity in electrostatic torque caused by large angular rotations of the reflective central mirror portion 420. Accordingly, the range of stability of the reflective central mirror portion 420 with respect to its angular deflection may be increased and a wider range of angular deflection may be realized by deterring effects of the electrostatic non-linearity for larger angular deflections.

The restoring torque available from the torsional hinges 410 alone may be insufficient at times to counteract the torque exerted by the electrostatic field at some critical rotation angle. The tether members 50 serve to provide additional restoring torque to combine with the hinge restoring torque, thus offsetting the electrostatic torque. Therefore, the point of instability can be changed to occur at larger deflection angles. Also, the resonant frequency of the reflective central mirror portion 420 is preferably increased due to the additional effective torsional spring constant created by the tether members 50. Hence, the resonant frequency is somewhat further decoupled from the actuation voltage.

In designing the tether members 50, the non-linearity of the tether members 50 dominates at roughly the same angular deflection that causes the electrostatic force to dominate. In an embodiment where the tether members are straight beams, the tether 50 stretches significantly; therefore, the non-linearity in the deflection of the beam deflection becomes apparent for rather small reflective central mirror portion 420 angles. The use of transverse channels 54 serves to extend the linear range of the tether member 50 by allowing for the stretching to be largely accommodated by the bend in the corrugation. Onset of effective non-linearity in the tether member 50 is a function of the length (c) of the tether member 50, its width (d), its thickness (t), the depth (e), the width (f) and the number of corrugations. By including the transverse channels 54, the tether member 50 further allows design flexibility in determining the onset of non-linearity. Preferably, the tether thickness (t) is made smaller than the thickness of the reflective central mirror portion 420 so that the non-linear force from the tether member 50 does not cause excessive warping of the reflective central mirror portion 420.

Figure 6:
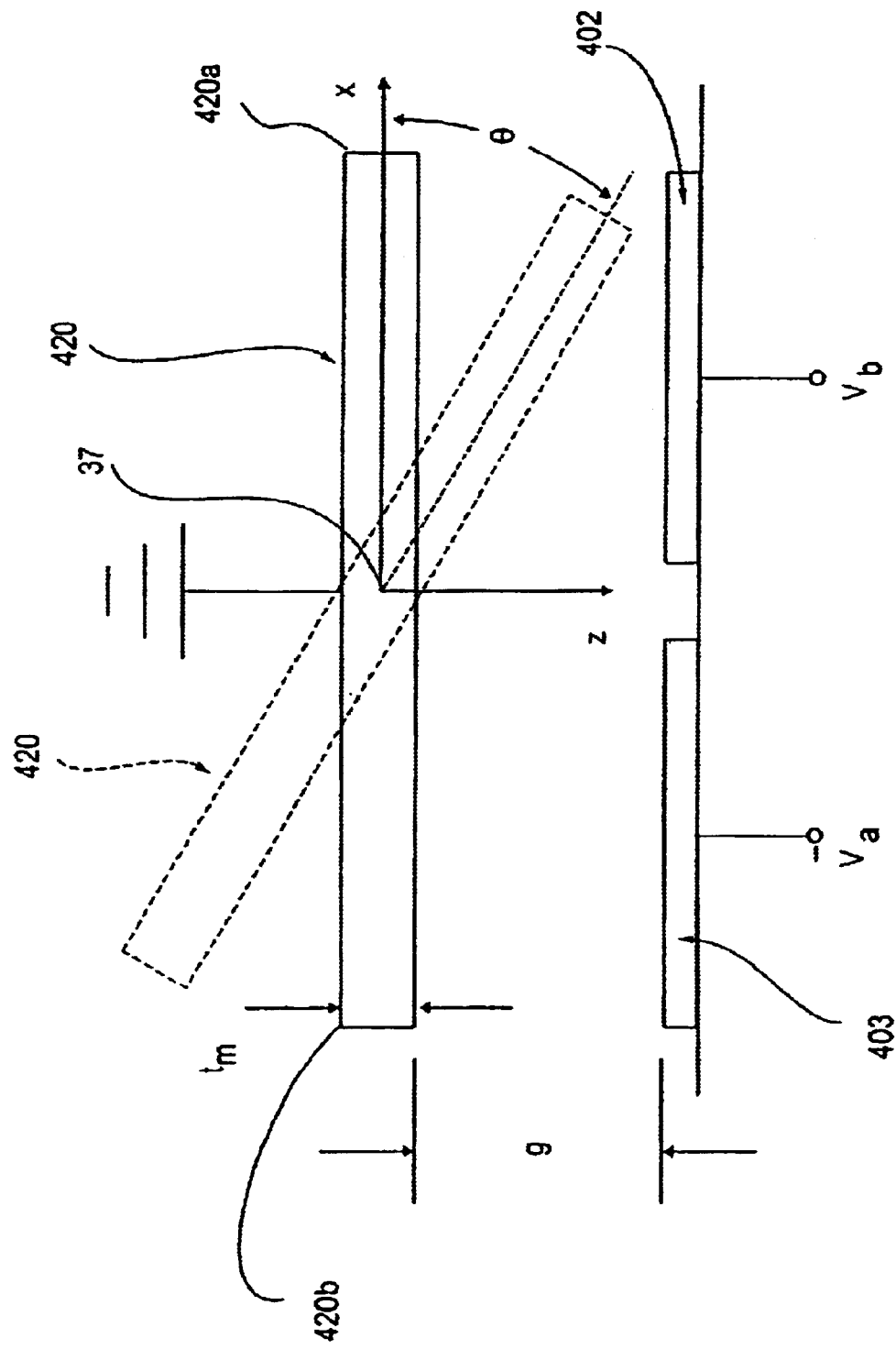
FIG. 6 is a cross sectional side view of the mirror of FIG. 2 illustrating in a dotted representation the mirror torsionally pivoting downwardly at an angle theta θ towards an actuation electrode.

Referring now to FIG. 6, as the angle $\theta$ of the reflective central mirror portion 420 increases about axis 37 with respect to the x axis, the contribution of electrostatic force coming from the portion of the actuation electrode 402 (or 403 ) at x=0 is less than the outboard edge of the reflective central mirror portion 420 at x=b/2. Referring back to FIG. 5, the steerable micro-machined mirror assembly 400 is illustrated to show the gap, g, at x=0 may be decreased without interfering with the total desired angular deflection and so as to provide more electrostatic force to the reflective central mirror portion 420 for a given electrode voltage, while improving linearity.

In the embodiment illustrated in FIG. 5 and discussed in Example 4 below, the actuation electrodes 402 and 403 may be fabricated to include electrode surfaces 402a and 403a as a vertical step or elevation such that the gap is decreased near x=0. Actuation electrodes 402 and 403 may also include electrode surfaces 402b and 403b respectively parallel to electrodes surfaces 402a and 403a that are respectively at a different gap spacing; that is, electrode surfaces 402a and 403a are at a smaller gap spacing than electrode surfaces 402b and 403b. Although FIG. 5 indicates two gap separations, additional benefit could be gained by fabricating a larger number of such steps in the electrodes 402 and 403. Therefore, while actuation electrodes 402 and 403 are each shown with two electrode surfaces (i.e., 402*a* and 402*b* and 403*a* and 403*b*), the spirit and scope of the present invention may include actuation electrodes 402 and 403 that comprise three or more electrode surfaces. This modification acting separately from the tether members 50 may serve to decouple the actuation voltage performance from the steerable micro-machined mirror assembly 400 resonant frequency, in that, the resonance of the steerable micro-machined mirror assembly 400 is unchanged. It is to be understood that a plurality of electrode steps may be used alone or in combination with the tether members 50 described above.

Figure 7:
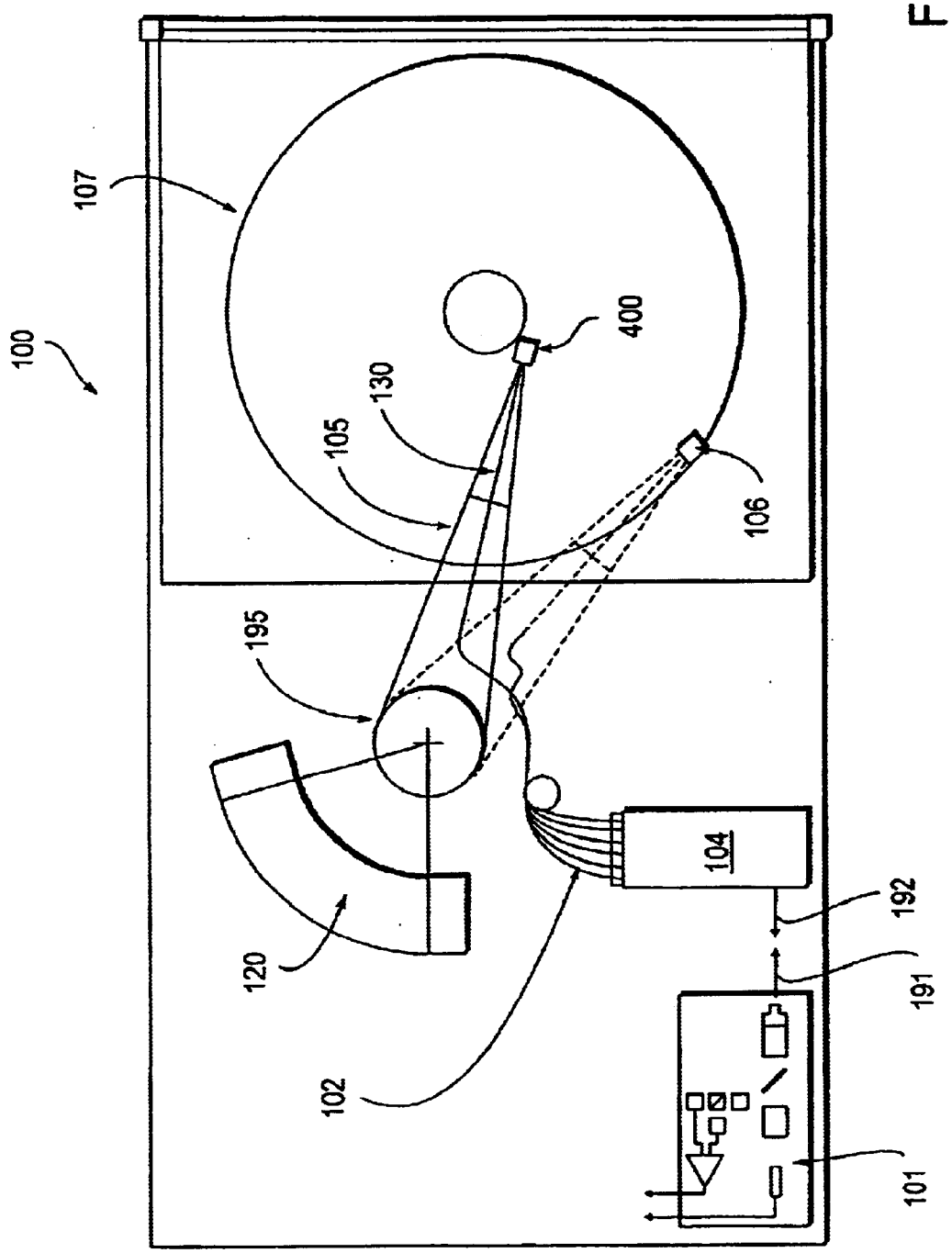
FIG. 7 is a top view of a magneto-optical data storage and retrieval system.

The steerable micro-machined mirror assembly 400 may be used with a flying magneto-optical head 106 as part of a magneto-optical storage and retrieval system, generally illustrated in a top view as 100 in FIG. 7. In a preferred embodiment, a magneto-optical (MO) data storage and retrieval system 100 includes a set of Winchester-type flying heads 106 that are adapted for use with a set of double-sided first surface MO disks 107 (one flying head for each MO disk surface). The set of flying heads 106 (hereinafter referred to as flying MO heads) are coupled to a rotary actuator magnet and coil assembly. 120 by a respective suspension 130 and actuator arm 105 so as to be positioned over the surfaces of the set of MO disks 107. In operation, the set of MO disks 107 are rotated by a spindle motor 195 so as to generate aerodynamic lift forces between the set of flying MO heads 106 and so as to maintain the set of flying MO heads 106 in a flying condition approximately 15 micro-inches above the upper and lower surfaces of the set of MO disks 107. The lift forces are opposed by equal and opposite spring forces applied by the set of suspensions 130. During non-operation, the set of flying MO heads 106 are maintained statically in a storage condition away from the surfaces of the set of MO disks 107.

System 100 further includes: a laser-optics assembly 101, an optical switch 104, and a set of single-mode PM optical fibers 102. Each of the set of single-mode PM optical fibers 102 may be respectively coupled through a respective one of the set of actuator arms 105 and set of suspensions 130 to a respective one of the set of flying MO heads 106. As will be discussed shortly, the steerable micro-machined mirror assembly 400 is used with the set of flying MO heads 106 in a configuration that, compared to the prior art, enables improved access to the high areal storage density of magneto-optical storage media, reduces the flying head weight and size, improves disk access time, requires fewer optical components, and increases the number of storage disks that may be operated within a given volume.

Figure 8:
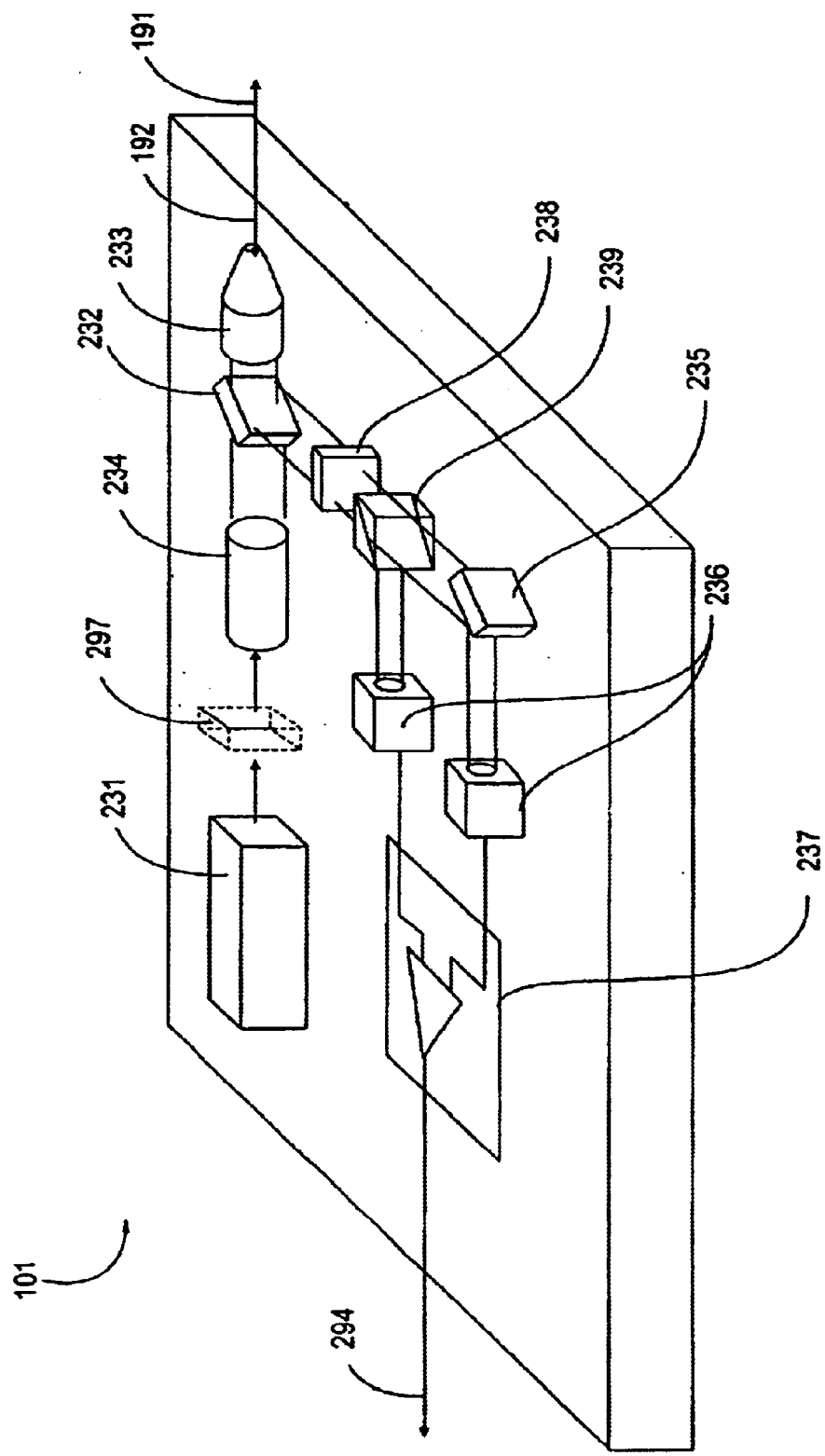
FIG. 8 is a diagram showing one embodiment of the laser-optics assembly of the magneto-optical data storage system of FIG. 7.

FIG. 8 is a diagram showing one embodiment of the laser-optics assembly of the magneto-optical data storage and retrieval system of FIG. 7. The laser-optics assembly 101 is shown to include a linearly polarized diode laser source 231 operating in a visible or near ultraviolet frequency region and emitting an optical power sufficient for reading and writing using the set of MO disks 107. In one embodiment the laser diode source may be a RF modulated laser source. In a second embodiment the linearly polarized laser source 231 may be a DFB laser source. In an exemplary embodiment, the linearly polarized laser source 231 operates within a range 635–685 nm; however, a laser source of other frequencies could also be used. The laser-optics assembly 101 further includes: a collimating optics 234, a low wavelength dispersion leaky beam splitter 232, and a coupling lens 233. The laser-optics assembly 101 directs (from the linearly polarized laser source 231) a linearly polarized outgoing laser beam 191 (shown in FIG. 7) to the optical switch 104. Laser-optics assembly 101 further includes: a ¼ wave plate 238, a mirror 235, and a polarizing beam splitter 232. In the first embodiment, a linearly polarized reflected laser beam 192 (shown in FIG. 7) is directed by the optical switch 104 to the coupling lens 233, and is routed by the leaky beam splitter 232 to a differential detector comprising: the ¼ wave plate 238, the mirror 235, and the polarizing beam splitter 239. In the second embodiment, the laser-optics assembly functions as above, but further includes an optical isolator 297 between the laser source 231 and the collimating lens 234. As is well established in the art, this type of differential detection scheme measures the optical power in two orthogonal polarization components of the reflected laser beam 192, with a differential signal being a sensitive measure of polarization rotation induced by the Kerr effect at the surface of one of the set of MO disks 107. In both embodiments, after conversion by a set of photodiodes 236, the differential signal is processed by the differential amplifier 237 and is output as signal 294. The present invention is not meant to be limited to the aforementioned arrangement of optical elements and sources of light, as other techniques for directing the outgoing laser beam 191 and for detecting the reflected laser beam 192 are well known in the art.

Figure 9:
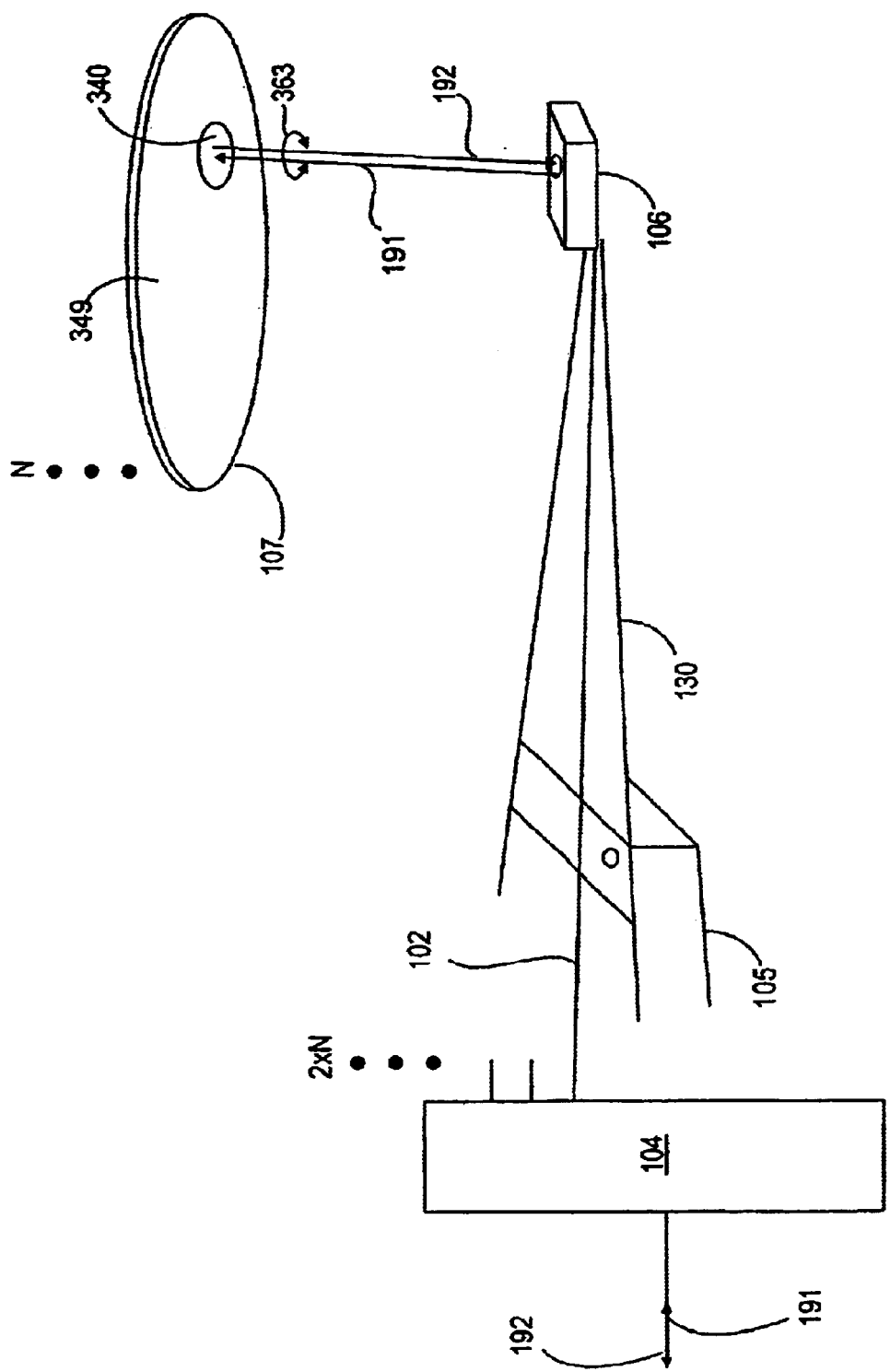
FIG. 9 is a diagram showing a representative optical path that includes the use of a DFB laser source.

FIG. 9 is a diagram showing a representative optical path that includes the use of a DFB laser source. In a preferred embodiment, a representative optical path is shown in FIG. 9 to include: the optical switch 104, one of the set of single-mode PM optical fibers 102, and one of the set of flying MO heads 106. The optical switch 104 provides sufficient degrees of selectivity for directing the outgoing laser beam 191 (with reference to laser source 231) to enter a respective proximal end of a respective single-mode PM optical fiber 102. The outgoing laser beam 191 is further directed by the single-mode PM optical fiber 102 to exit a respective distal end so as to pass through the flying MO head 106 onto a surface recording layer 349 of a respective MO disk 107. In the preferred embodiment the outgoing laser beam 191 is provided by a linearly polarized laser source 231 that is a DFB laser source. A distributed feedback (DFB) diode laser source, unlike an RF-modulated Fabry-Perot diode laser, produces a very narrowband single-frequency output due to the use of a wavelength selective grating element inside the laser cavity. When linearly polarized light from a laser source 231 that is a DFB laser source is launched into a single-mode PM optical fiber 102, the light exiting the optical fiber has a polarization state that depends on the relative orientation between the fiber axes and the incident polarization, and moreover, the output polarization state is very stable in time as long as external perturbations which alter the fiber birefringence are negligible. This behavior is in contrast to that observed with an RF-modulated Fabry-Perot diode laser source which is characterized by high-frequency fluctuations in its spectral output. With a RF modulated laser source, when linearly polarized light is launched into a single-mode PM optical fiber 102, the laser wavelength fluctuations lead to corresponding polarization fluctuations at the output of the fiber. The resulting polarization noise is minimized when the incident light is launched with its polarization axis aligned with one of,the axes of the fiber, but even in this case the polarization noise is larger than the corresponding DFB laser case owing to wavelength dependent mode coupling. (Mode coupling in PM fibers is a phenomenon whereby a small portion of the light that is being guided along one polarization axis is coupled into the orthogonal axis by intrinsic or stress-induced defects.) In MO recording it is important that the polarization noise be kept to a minimum, such that an SNR in the range of 20–25 dB can be achieved. When using a DFB laser source it is, therefore, possible to achieve this level of SNR in the magneto-optical (MO) data storage and retrieval system 100 when utilizing the single-mode PM optical fiber 102 for the delivery and return of the signal light to and from the MO disk 107.

During writing of information, the outgoing laser beam 191 is selectively routed by the optical switch 104 to the MO disk 107 so as to lower a coercivity of the surface recording layer 349 by heating a selected spot of interest 340 to at least the Curie point of the MO recording layer 349. Preferably, the optical intensity of outgoing laser beam 191 is held constant, while a time varying vertical bias magnetic field is used to define a pattern of "up" or "down" magnetic domains perpendicular to the MO disk 107. This technique is known as magnetic field modulation (MFM). Alternatively, outgoing laser beam 191 may be modulated in synchronization with the time varying vertical bias magnetic field at the spot of interest 340 in order to better control domain wall locations and reduce domain edge jitter. Subsequently, as the selected spot of interest 340 cools at the surface layer 349, information embodied in the outgoing laser beam 191 is encoded at the surface of the respective spinning disk 107.

During readout of information, the outgoing laser beam 191 (at a lower intensity compared to writing) is selectively routed to the MO disk 107 such that at any given spot of interest 340, the Kerr effect causes (upon reflection of the outgoing laser beam 191 from the surface layer 349) a reflected laser beam 192 to have a rotated polarization of either clockwise or counter clockwise sense 363 that depends on the magnetic domain polarity at the spot of interest 340. The aforementioned optical path is bidirectional in nature. Accordingly, the reflected laser beam 192 is received through the flying MO head 106 and enters the distal end of the single-mode PM optical fiber 102. The reflected laser beam 192 propagates along the single-mode PM optical fiber 102 to exit at its proximal end and is selectively routed by the optical switch 104 for transmission to laser-optics assembly 101 for subsequent conversion to the signal 294.

FIGS. 10-*a*–*d* are diagrams showing a magneto-optical head in a top view, a side view, a front view, and a side view, respectively. The set of flying MO heads may be illustrated with reference to a single representative flying MO head 106. A single representative flying MO head 106 is shown in FIGS. 10-*a*–*c* to be positioned respectively above or below a surface recording layer 349 of one of the set of spinning MO disks 107. In a preferred embodiment, the flying MO head 106 includes: a slider body 444, an air bearing surface 447, a transmissive quarter-wave plate 493, the steerable micro-machined mirror assembly 400, an objective optics 446, and a magnetic coil 460. In an exemplary embodiment, the magnetic coil 460 is a micro multi-turn coil positioned near the air-bearing surface 447 so as to generate a magnetic field that is: approximately 300 Oersteds of either polarity, reversible in a time of about 4 ns, and approximately perpendicular to the plane of the spinning MO disk 107. Preferably, the magnetic coil 460 should not interfere with the outgoing and reflected laser beams 191 and 192 during passage through the flying MO head 106 to the spinning MO disk 107, or vice versa. The slider body 444 dimensions may be characterized to include those of industry standard "mini", "micro", "nano", or "pico" sliders. As determined by mechanical dimensions and/or optical properties of the aforementioned elements comprising the flying MO head 106, alternatively dimensioned slider bodies 444 may also be used; accordingly, in the preferred embodiment, the slider body 444 may include a height of approximately 889 um and a planar footprint area that corresponds to that of a nano slider (2032 um×1600 um). In an exemplary embodiment, the quarter-wave plate 493 includes a square dimension of approximately 250 um, a thickness of approximately 89 um, and a phase retardation of about 90 degrees (+/−3 degrees) at a wavelength of interest. Single-mode PM optical fiber 102 is preferably coupled to the flying MO head 106 and is held along an axis of the slider body 444 by a v-groove 443 or other suitably dimensioned channel. The single-mode PM optical fiber 102 is positioned within the v-groove 443 to preferably direct the outgoing laser beam 191 as an optimally focused optical spot 448. The single-mode PM optical fiber 102 may be subsequently secured in place by using an ultraviolet curing epoxy or a similar adhesive. Use of the PM optical fiber 102 within a V-groove permits accurate alignment and delivery of the outgoing laser beam 191 to the small area of the reflective central mirror portion 420. The steerable micro-machined mirror assembly 400, the quarter-wave plate 493, and objective optics 446 are preferably compact and low mass so as to fit within a physical volume defined by approximating the rectangular outer dimensions of the slider body 444 and yet sufficiently large to direct a full cross section of the outgoing and reflected laser beams 191 and 192 so that minimal power is lost and significant distortion and aberrations in the outgoing and reflected laser beams 191 and 192 are not introduced.

The reflective central mirror portion 420 of the steerable micro-machined mirror assembly 400 is aligned in the representative optical path so as to direct the outgoing laser beam 191 through the objective optics 446 and quarter-wave plate 493, and the reflected laser beam 192 from the MO disk 107 back to the laser optics assembly 101 of FIG. 8. The objective optics 446 may be a microlens with a numerical aperture (NA) of approximately 0.67. In an exemplary embodiment at a wavelength of 650 nm, the micro-lens focuses the optical spot 448 with a full width at half-maximum intensity (FWHM) of approximately 0.54 um. The micro-lens may be a GRIN (Graded Index) lens 446, of simple and compact cylindrical shape. A cylindrical shape permits the lens 446 to be easily inserted into a simple cylindrical lens receiving aperture provided in the slider body 444. To minimize spherical aberration and achieve diffraction-limited focusing, the GRIN lens 446 may be polished to assume a piano-convex shape, with the convex surface being a simple spherical shape. The desired thickness and radius of curvature of the GRIN lens 446 is a function of a number of factors including: the magnitude of the refractive index gradient, the wavelength of light, the numerical aperture of the PM optical fiber 102, and the desired focused optical spot 448 size. In an exemplary embodiment, the GRIN lens 446 height is approximately 350 um, the radius of curvature is approximately 200 um, and the lens diameter may be approximately 250 um. The optimum focus occurs on the planar side of the GRIN lens 446 and preferably comprises a depth of focus that is approximately 25 micro-inches. Because flying height of the air bearing surface 447 is preferably maintained at a value to be approximately 15 micro-inches, a focusing servo is not necessarily required.

In an alternative embodiment, the present invention may include a linearly adjustable optical element 495 (shown in FIG. 10*b* and 10*d*). The linearly adjustable optical element may be positioned in the optical path between the single-mode PM optical fiber 102 and the reflective central mirror portion 420 so as to optically alter the outgoing laser beam 191 as the beam exits the single-mode PM optical fiber 102. The optical spot 448 may be focused to include exemplary focal positions 486, 487, and 488. Multi-layer MO disks could therefore be used. Linear motion of the optical element 495 along the representative optical path may be effectuated by coupling a moving means 433 to the slider body 444 and to a mount containing the optical element 495, for example, a micro-machined actuator, micro-motor, or piezoelectric transducer capable of linear motion. Alternatively, a single dynamic focusing lens with electrically controlled focus may be used in place of linearly adjustable optical element 495, obviating the need for a moving means. Such a lens may, for example, comprise a holographic lens element in combination with a liquid crystal or electro-optic P2ZT coating. Another possible approach for providing a variable focus is to provide a micro-machined actuator on the slider body 444 for moving the objective optics 446 in a linear direction perpendicular to the plane of the MO disk 107. A micro-machined actuator may also be used to position the single-mode PM optical fiber 102 in a lateral, vertical, or longitudinal direction, thus, providing a means of movement and alignment of the single-mode PM optical fiber 102 relative to other optical elements on the slider body 444. A number of micro-actuator designs are referenced in "Silicon-Micro-actuators: Activation Mechanisms And Scaling Problems," W. Benecke, 1991 International Conference on Solid-State Sensors and Actuators, pp. 46–50, and the papers referenced therein.

The single-mode PM optical fiber 102 functions as an aperture of a confocal optical system that has a large depth resolution along its optical axis and an improved transverse resolution. The improved transverse resolution improves the detection of smaller magnetic domain orientations as well as detection of magnetic domain edges as compared to a non-confocal system. The large depth resolution minimizes cross-talk between closely spaced surface recording levels when using multi-level storage media. Another advantage that arises from the confocal nature of the present invention is that stray light reflected from the objective optics 446 is filtered.

As used in the magneto-optical storage and retrieval system 100, fine tracking and short seeks to nearby tracks are performed by rotating the reflective central mirror portion 420 of the steerable micro-machined mirror assembly 400 about a rotation axis so that the propagation angle of the outgoing laser beam 191 is changed before transmission to the objective optics 446. The reflective central mirror portion 420 is rotated by applying a differential voltage to the drive electrodes 402 and 403. The differential voltage on the electrodes 402 and 403 creates an electrostatic force that rotates the reflective central mirror portion 420 about the hinges 410 and enables the focused optical spot 448 to be moved in the radial direction 450 on the MO media 107. In an exemplary embodiment, the central mirror portion 420 rotates approximately +/−2 degrees, which is equivalent to approximately the width of +/−4 tracks at the surface of the MO disk 107. Although, in the exemplary embodiment a movement of +/−4 tracks is disclosed, depending on the desired performance characteristics of the steerable micro-machined mirror 400 described above, a range of movement greater or fewer than +/−4 tracks is understood to also be possible. Consequently, movement of the focused optical spot 448 across the MO disk 107 and detection of the reflected laser beam 192 may be used in storage and retrieval of information track following, and seeks from one data track to another data track. Coarse tracking may be maintained by adjusting a current to rotary actuator magnet and coil assembly 120 (FIG. 7). The track following signals used to follow a particular track of the MO disk 107 may be derived using combined coarse and fine tracking servo techniques that are well known in the art. For example, a sampled sector servo format may be used to define tracks. The servo format may include either embossed pits stamped into the MO disk 107 or magnetic domain orientations that are read similar to data marks. If embossed pits are used, an adder output circuit may be used in place of the differential output circuit 237. Those skilled in the art will recognize that conventional prior art multiple magnetic disk Winchester magnetic disk drives use a set of respective suspensions and actuator arms that move in tandem as one integral unit. Therefore, because each flying head of such an integral unit is fixed relative to another flying head, during track following of a particular magnetic disk surface, simultaneous track following of another magnetic disk surface is not possible. In contrast, irrespective of the movement of the set of actuator arms 105 and set of suspensions 130, a set of steerable micro-machined mirror assemblies 400 may be used to operate independently and thus permit track following and seeks so as to read and/or write information using more than one MO disk surface at any given time. Independent track following and seeks using a set of concurrently operating steerable micro-machined assemblies 400 preferably requires a set of separate respective read channel and fine track electronics and mirror driving electronics. Because the aforementioned embodiment would also preferably require use of separate laser-optics assemblies 101, an optical switch 104 for switching between each of the separate optical paths may not necessarily be required.

Figure 11:
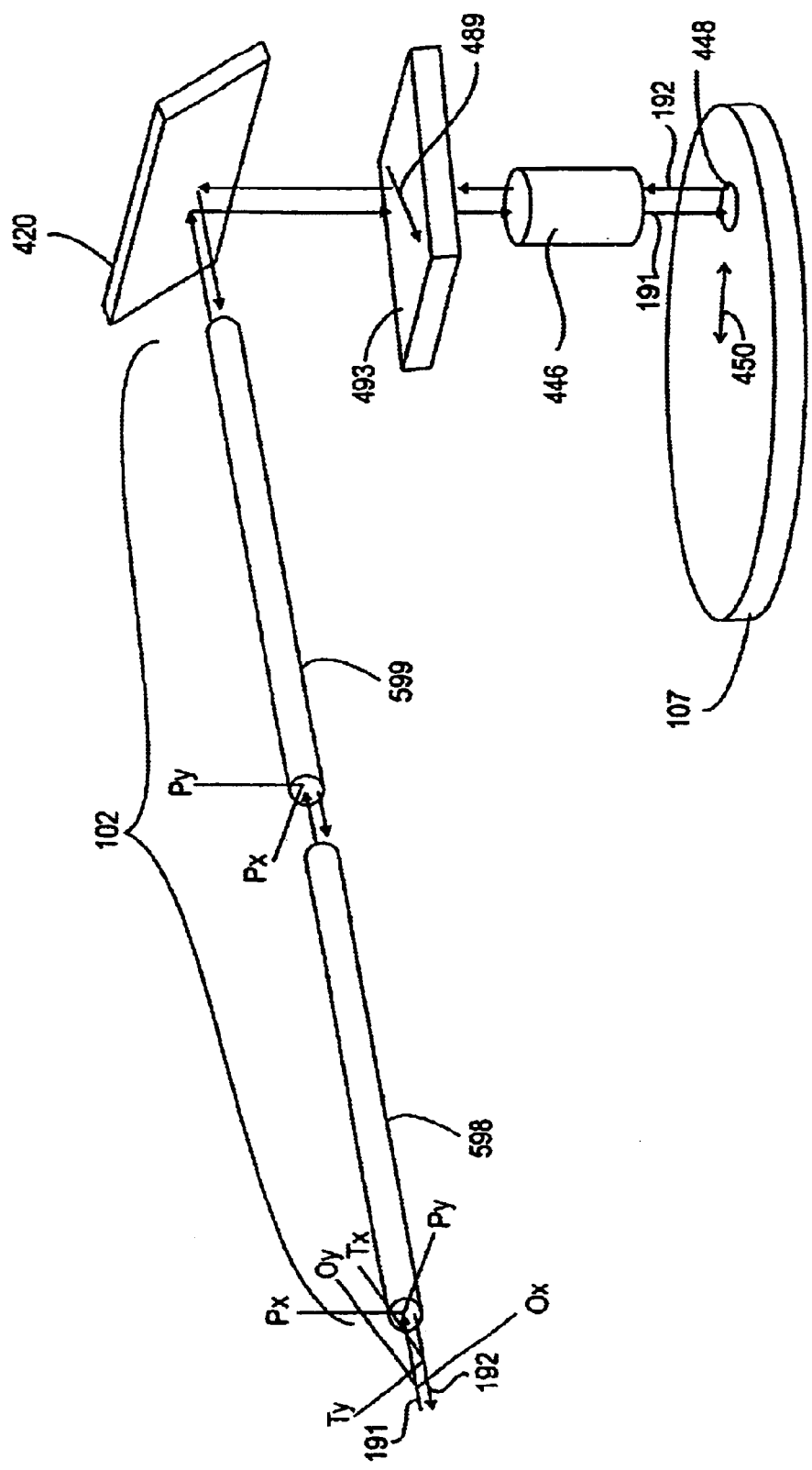
FIG. 11 is a diagram showing the representative optical path of FIG. 9 in further detail.

FIG. 11 is a diagram showing a representative optical path that includes the use of a RF modulated laser source. The set of optical paths of the present invention may be illustrated with reference to a single representative optical path, which is shown in FIG. 11 to include: the reflective substrate 420, the quarter-wave plate 493, the objective optics 446, and the single-mode PM optical fiber 102. In an embodiment that uses a RF modulated laser source 231, the single-mode PM optical fiber 102 comprises a first segment 598 coupled to a second segment 599, each segment comprising a fast axis (Px) and slow axis (Py). The fast axis of the first segment 598 is preferably aligned with the slow axis of the second segment 599. The outgoing laser beam 191 has an Ox component and an Oy component and is preferably linearly polarized at an angle of approximately 45 degrees relative to the Px and Py axes of the first segment 598, and the quarter-wave plate 493 comprises a fast axis 489 which is preferably aligned in the optical path at an angle of 45 degrees relative to the Px and Py axes of the second segment 599. In an exemplary embodiment, the quarter-wave plate 493 comprises a square dimension of about 250 um, a thickness of about 89 um, and a phase retardation of about 90 degrees (+/−3 degrees) at a wavelength of interest.

Those skilled in the art will recognize that the first and second segments 598 and 599 may be subject to external and/or internal stresses resulting from: mechanical motion, temperature, and pressure; and that, these stresses may affect optical properties of the first and second segments 598 and 599, for example, their birefringent properties. Accordingly, as the Ox and Oy polarization components propagate through the first and second segments 598 and 599, the Oy component acquires a shift in phase of φ relative to the Ox component. The polarization components Ox and Oy exit the distal end of the second segment 599 and are reflected by the reflective substrate 420 so as to be incident with the surface of the quarter-wave plate 493. The Ox and Oy components are preferably reflected equally (within 3% of each other) from a gold surface of the reflective substrate 420. As the Ox and Oy components pass through the quarter-wave plate 493, the Ox component is converted to a left-hand circular polarization, and the Oy component is converted to a right-hand circular polarization, and the two circular polarizations sum to preferably be an outgoing linear polarization having a polarization angle that depends on the phase shift $\phi$. The outgoing linear polarization is reflected from the MO disk 107 and is rotated by the Kerr effect so as to return with a net phase shift between the circular polarization components equal to $\phi+\Delta$, where $\Delta$ is a phase shift introduced by the Kerr effect. The reflection from the MO disk 107 reverses the sense of each circular polarization (i.e., left-hand becomes right-hand and vice-versa), such that, upon a second pass through the quarter-wave plate 493, the right-hand component is converted to a linear polarization component Tx, and the left-hand component is converted to a linear polarization component Ty. The Tx and Ty polarization components of the reflected laser beam 192 are preferably rotated 90 degrees with respect to the Ox and Oy polarization components of the outgoing laser beam 191, and the Tx component exhibits a phase shift of $\phi+\Delta$ relative to the Ty component. Those skilled in the art will recognize that in an exemplary embodiment, in which the optical transit time through the PM optical fiber is less than 5 ns, the birefringence of the PM optical fiber will not change appreciably; thus, as the Tx polarization component of the reflected laser beam 192 propagates back through the second and first segments 599 and 598, the Ty component acquires an additional phase shift of $\phi$ with respect to the Tx component. In this manner, after exiting the proximal end of the first segment 598, the Ty polarization component of the reflected laser beam 192 is phase shifted relative to the Tx polarization component, preferably by only the Kerr phase $\Delta$. The polarization state that emerges from the fiber is elliptical and is converted by the quarter-wave plate 238 of laser-optics assembly 101 to preferably have a linear polarization with a polarization angle proportional to $\Delta$. Subsequently, the linear polarization is detected and converted so as to represent the information stored at the spot of interest 340 as the output signal 294. Although the present invention minimizes the effects of birefringence introduced by the first and second segments 598 and 599, the quarter-wave plate 493 also minimizes phase shifts introduced by the optical properties of the reflective surface of the reflective substrate 420. Additionally, although the quarter-wave plate 493 is disclosed to be positioned in the optical path after the reflective substrate 420, in an alternative embodiment, the quarter-wave plate 493 may be positioned between the objective optics 446 and the MO disk 107.

The present invention recognizes that use of a laser source 231 (FIG. 8) that comprises a RF modulated laser diode may reduce the effects of optical feedback of the reflected laser beam 192 to the laser diode. Those skilled in the art will recognize that RF modulated diodes do not operate at a single wavelength, but rather, as a source of laser light having mullet-mode spectral characteristics (typically with a 10 nm bandwidth) and that for each $\lambda$, the corresponding phase shift may be minimized by specifying the quarter-wave plate 493 to operate over the bandwidth of the laser source 231. However, those skilled in the art will recognize that when the Ox and Oy components of the outgoing laser beam 191 are not optimally aligned at 45 degrees relative to the Px and Py axes of the first segment 598, and/or the quarter-wave plate 493 is not exactly quarter-wave, and/or other optical components in the optical path are not aligned, the phase shift $\phi$ and, thus, the RF noise components it generates in the output signal 294 may exhibit a dependence on the wavelength fluctuations of the laser source 231. Accordingly, because in practice the optical components of system 100 may be aligned to only a limited degree of precision, the wavelength fluctuations of the RF-modulated laser source 231 may function to degrade the signal-to-noise ratio of the output signal 294.

The present invention identifies that by rotating the first axis of the first segment 598 orthogonally to the fast axis of the second segment 599, the RF phase noise created by wavelength fluctuations of the laser source 231 may be canceled in a common mode manner. The first and second segments 598 and 599 may comprise commercially available single-mode PM optical fiber selected to operate at the frequency of interest. The first segment 598 is coupled to the second segment 599 using fusion splicing techniques that are well known in the art, and the fast axis of the first segment 598 is aligned with the slow axis of the second segment 599, preferably to within an angle of less than 0.5 degree. Additionally, the first and the second segments 598 and 599 are preferably selected from the same optical fiber manufacturing batch and are preferably of equal length to a precision of less than 1 mm. Those skilled in the art will understand that the phase shift encountered by a linearly polarized light propagating with a wavelength $\lambda$ through each of the first and second segments 598 and 599 is proportional to $2\pi bL/\lambda$ (where b is the birefringence of the PM optical fiber and L is the PM optical fiber length). Therefore, fluctuations in the wavelength $\lambda$ yield corresponding fluctuations in the phase shift. By aligning the fast axes of the first and second segments 598 and 599 of the PM optical fiber 102 orthogonally to each other and by selecting the two segments 598 and 599 to be approximately equal in length, the present invention identifies that the net birefringence introduced in the optical path by the two segments will be approximately zero and, thus, the phase shift $\phi$ will be approximately zero and independent of wavelength. In practice, the non-zero net birefringence will be proportional to the difference between the lengths of the first and the second segments 598 and 599, hence, as compared to the prior art, the RF phase noise in the output signal 294 will be reduced. In the embodiment using the RF modulated laser source 231, as compared to an embodiment (not shown) in which a continuous one meter in length PM optical fiber is used in place of the first and second segments 598 and 599, the signal-to-noise ratio of the output signal 294 is reduced approximately 40 dB.

Figure 12:
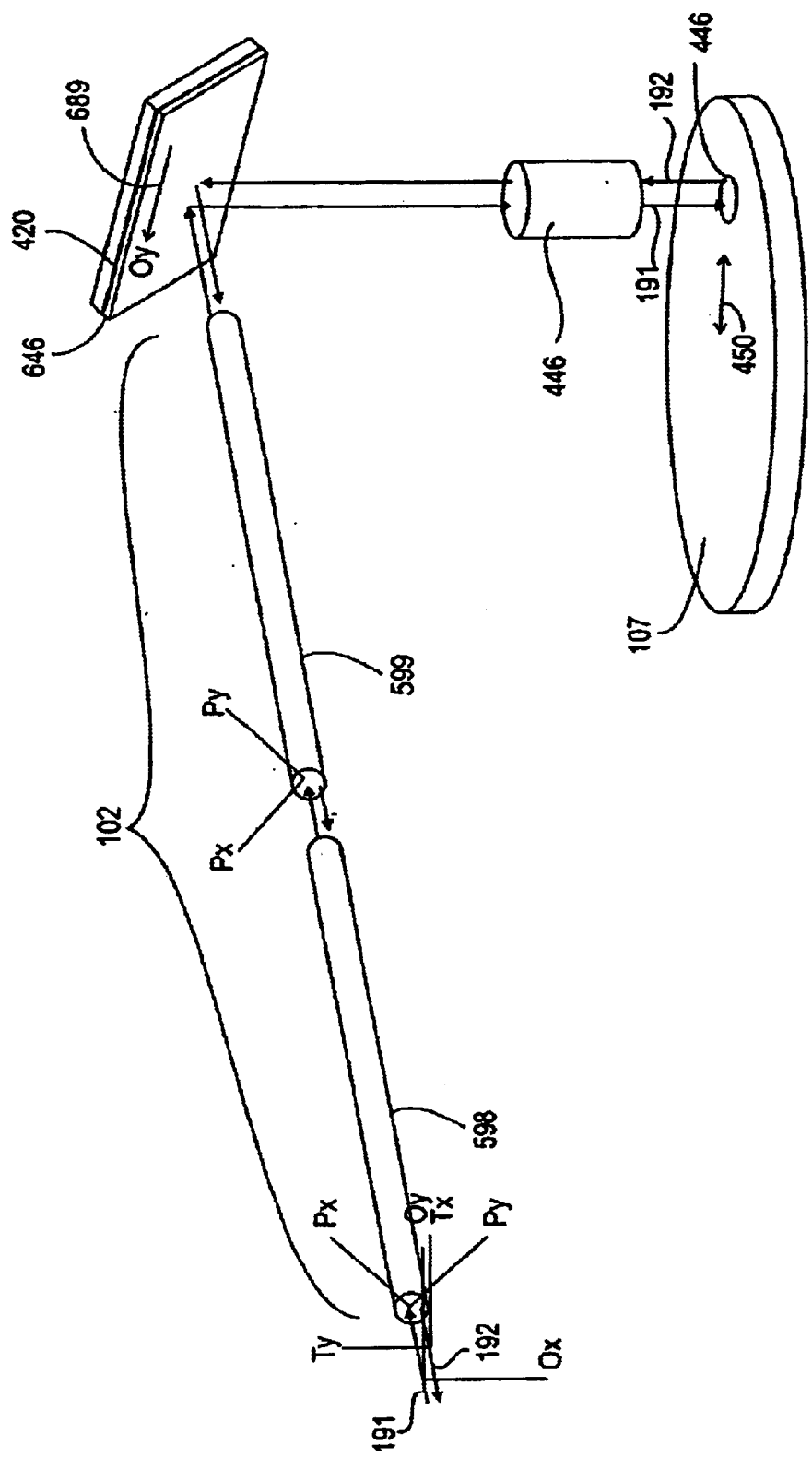
FIG. 12 is a diagram showing a steerable micro-machined mirror assembly that includes a reflective type quarter-wave plate.

FIG. 12 is a diagram showing the representative optical path of FIG. 11 in a second embodiment. In the second embodiment shown in FIG. 6, a multi-layer stack 646 of alternating layers of ZnS (high refractive index) and $SiO_2$ (low refractive index) materials is deposited on a reflective substrate 420. FIG. 13 illustrates the thickness of the various layers for an exemplary embodiment having a total of 12 layers. In the second embodiment, a thick layer of gold is deposited as a first layer on the reflective substrate 420 to improve reflectivity at low incidence angles. The thickness of the layers is controlled during deposition on the reflective substrate 420 so that mean reflectance from the reflective substrate 420 is preferably greater than 95% and so that, reflected components of a linearly polarized light source incident on the multi-layer stack 646 (within an incidence angle of 45 degrees +/−10 degrees) acquire an phase retardation of 90 degrees (+/−1 degree). The exemplary embodiment is not meant to be limiting, as other operating wavelengths and different numbers of layers, each with a different thickness, could be deposited on the reflective substrate 420. In the second embodiment, the multi-layer stack 646 functions as a quarter-wave plate. The effective fast axis 689 of the quarter-wave plate is preferably aligned in the optical path at an angle of 45 degrees relative to the Px and Py axes of the second segment 599. Accordingly, in the second embodiment, the multi-layers 646 function to reduce birefringence induced phase shifts between the Tx and Ty components of the outgoing laser beam 192. Because the materials used for the design are preferably not birefringent, neither phase retardation nor reflectance depends on the azimuth of the incidence. By reducing the number of discrete optical components on the flying MO head 106 (i.e., a separate quarter-wave plate 493), the quarter wave-plate multi-layer stack 646 of second embodiment effectuates low mass and low-profile optical paths having fast seek and data transfer rates, and increased data storage capacity per unit volume. While the present invention has been described with reference to one type of polarization altering element (i.e., a quarter-wave plate), those skilled in the art will recognize that with suitable changes in the detection optics of laser optics assembly 101, other types of polarization altering elements could be used on the flying MO head 106, for example, a faraday rotator.

Figure 14:
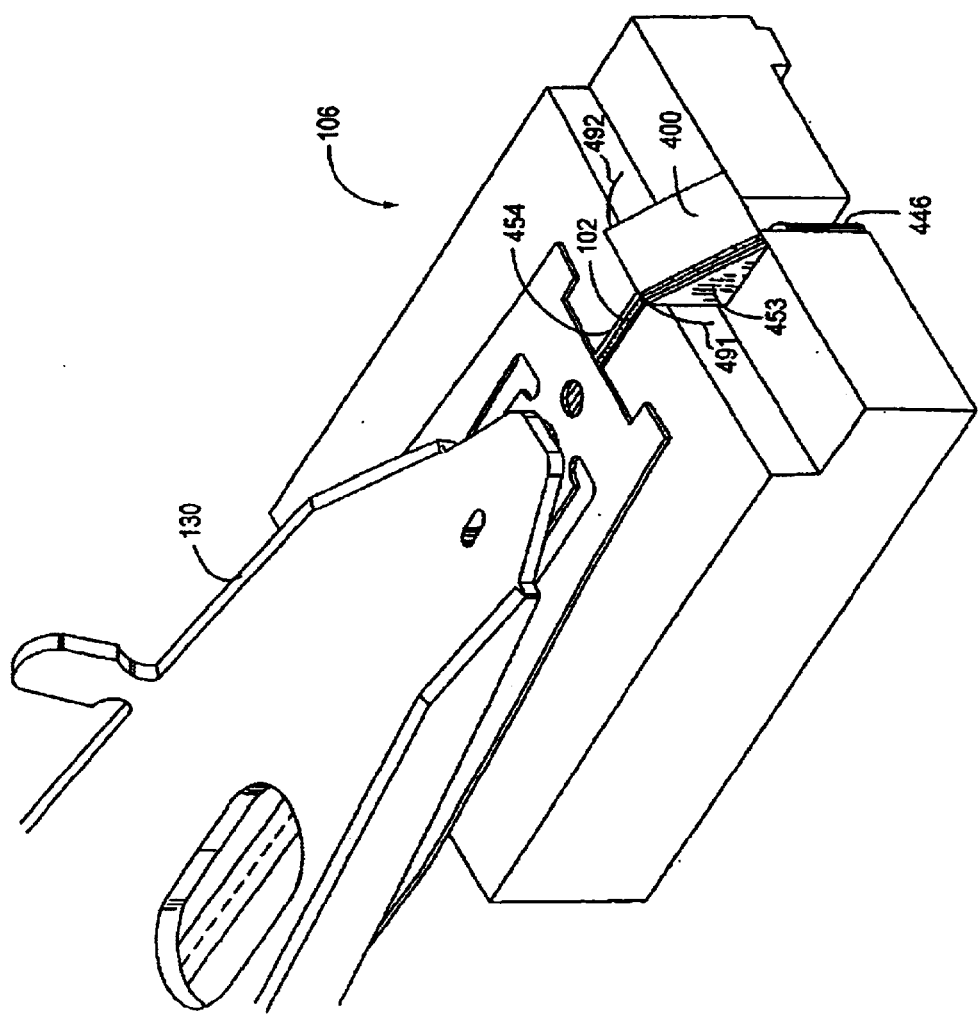
FIG. 14 is a perspective view of an embodiment of the flying magneto-optical head shown in FIGS. 10-a–c.
Figure 15:
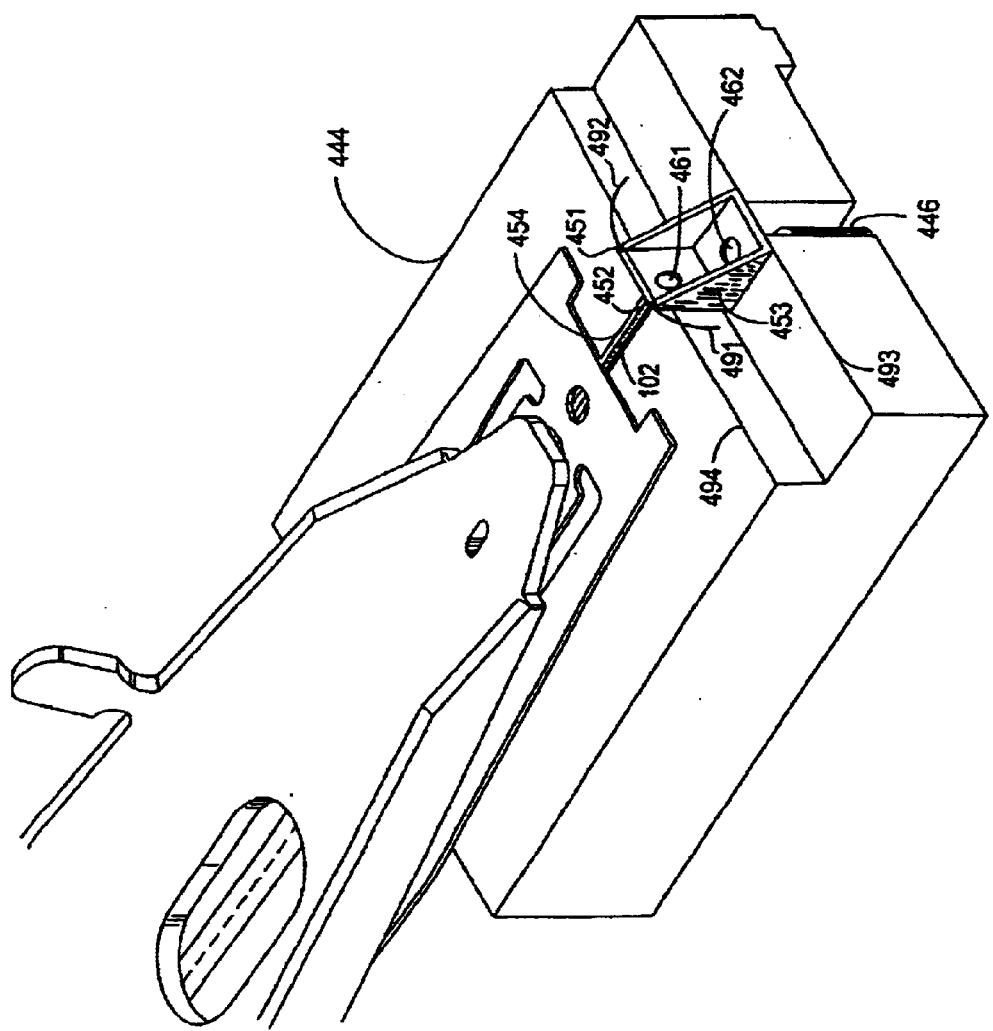
FIG. 15 is a second perspective view of an embodiment of the flying magneto-optical head shown in FIGS. 10-a–c.

Referring in detail now to FIGS. 14 and 15, the magneto-optical data storage and retrieval system 100 of FIG. 10 provides the ability to rapidly move a focused beam of laser light across the MO disk 107 by incorporating the steerable micro-machined mirror assembly 400 with a flying magneto-optical head 106. With reference to the slider body 444 shown in FIG. 10, a mirror support 453 may be provided for attachment of the steerable micro-machined mirror assembly 400. The mirror support 453 includes raised electrode pads 451 and 452 that provide an electrical contact point for application of a differential voltage to the set of corresponding pads 404 and 405 (refer to FIG. 2) located on the steerable micro-machined mirror assembly 400. Alternatively, direct wire bonding techniques may be used to provide a connection to the electrodes 402 and 403 so as to eliminate the need for bonding pads 404 and 405 and, thus, a concomitant alignment step with the electrode pads 451 and 452. In the particular embodiment shown, mirror support 453 further includes access holes 461 and 462 so as to provide a clear optical path from the single-mode PM optical fiber 102 to the reflective central mirror portion 420 (not visible), and subsequently, to the surface of the MO disk 107. The mirror support 453 provides the steerable micro-machined minor assembly 400a support surface oriented at a 45 degree angle relative to the optical path from the optical fiber 102. Those skilled in the art will understand that mirror support 453 may be attached to the slider body, 444 and manufactured using any number of techniques, for example, by micro-machining the slider body 444 and the mirror support 453 separately, then adhesively bonding the two pieces together.

A 45 degree support angle for the steerable micro-machined mirror assembly 400 may be provided by using other techniques, for example, by leaning the mirror assembly 400 against a suitably dimensioned slider having suitably dimensioned steps 493 and 494. In another embodiment, the slider body may manufactured to provide a 45 degree beveled edge along which the steerable micro-machined mirror assembly 400 may be positioned. In yet another alternative embodiment, the steerable micro-machined mirror assembly 400, the slider body 444, and the V-groove 454 for holding the PM optical fiber 102, may be micro-machined as a flying MO head that comprises one integral piece. An integral micro-machined flying MO head can reduce the amount of pre and post manufacturing alignment necessary for accurate focusing of the optical spot 448 (shown in FIG. 10-c) on the MO disk 107. The slider body 444 may also be micro-machined to include the aforementioned micro-machined actuator as an integral element.

Figure 16:
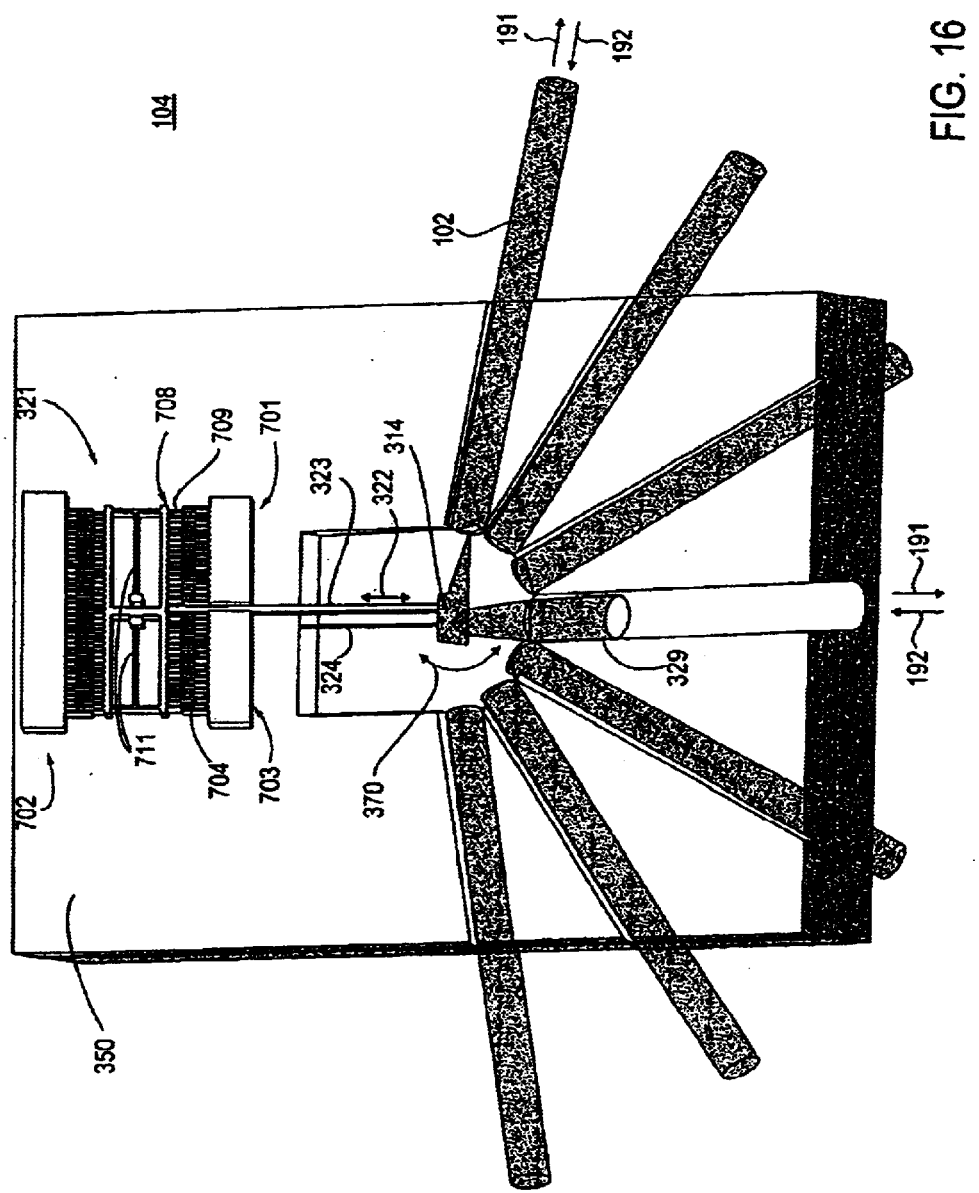
FIG. 16 illustrates an embodiment of the fiber optic switch.

Referring now to FIG. 16, an embodiment of the optical switch illustrated in FIG. 7 is shown in detail. The fiber-optic switch 104 is of a small size so as to require only a small volume within the magneto-optical system 100. The optical switch preferably provides a fast switching speed between a set of optical paths that include the set of single-mode PM optical fibers 102 and the laser-optics assembly 101. In a preferred embodiment, the optical switch 104 comprises: an upper silicon substrate 350; a linear micro-machined micro-motor 321 ; a micro-machined mirror 314 ; and generally parallel and spaced apart transverse flexure members 323 and 324. Adjacent spaced apart ends of flexure members 323 and 324 are connected to a movable output of the micro-motor 321 and a fixed location on substrate 350, respectively. The opposed adjacent ends of flexure members 323 and 324 are connected to adjacent spaced apart locations on the micro-mirror 314 to provide pivot axes oriented generally vertically with respect to a top surface of the substrate 350. The flexure 324 provided a transversely fixed reference mechanical fulcrum relative to the transversely movable flexure 323. In the preferred embodiment, a set of output optical fibers 102 are disposed such that their respective optical axes are angularly displaced parallel to the substrate 350 and directed generally in a radial direction toward the mirror 321. A free space outgoing laser beam 191 from the laser-optics assembly 101 is directed toward an aperture formed in the substrate 350. As shown in FIG. 16, the outgoing laser beam 191 is directed towards a reflective face of the mirror 314 through the aperture and through a GRIN lens 329 aligned thereto. The GRIN lens 329 is preferably disposed into an etched groove in the substrate 350. After emerging from the GRIN lens 329, the laser beam 191 is reflected by the micro-mirror 314.

A suitable electric potential is applied to the micro-motor 321 such that the outgoing laser beam 191 is reflected from the micro-mirror 314 and directed to a selected one of the set of optical fibers 102. The micro-motor 321 imparts motion (indicated by the double headed transverse arrow 322) to the flexure 323 relative to flexure 324 by rotatably displacing the micro-mirror 314 about its pivot axis. The micro-mirror 314 is provided thereby with an angular motion degree of freedom indicated by double headed arrow 370 parallel to the plane of the substrate 350.

The angular position of the micro-mirror 314 is determined by the electric potential applied to the micro-motor 321, and the outgoing laser beam 191 is focused by the GRIN lens 329 to one of a set of points several microns from the reflective face of the mirror 314. Preferably, the points correspond to the proximal ends of each of the single-mode PM optical fibers 102. The rotational range of motion of the mirror 314 is preferably sufficient to direct the outgoing laser beam to any one of the PM optical fibers 102. Although, the aforementioned in-plane rotation 370 provides one degree of deflection and alignment, another degree of deflection and alignment is provided by an out-of-plane motion of the micro-mirror 314, as is discussed with reference to FIGS. 17a–b below.

Referring now to FIGS. 17-a–b, the optical switch 104 is shown to further include: a support portion 412, a patterned first insulator oxide layer "hinge" portion 416, a conductor layer pattern 425, a patterned second insulator oxide layer portion 418, and a reflective surface 415. In the preferred embodiment, the reflective surface 415 is deposited on the face of the micro-mirror 314 as a metal such as gold. Respective opposed edges of the micro-mirror 314 are connected to corresponding edges of the support portion 412 by the respective insulator portions 416 at one edge and insulator portion 418 at the outer edge. Both of the insulator portions 416 and 418 provide dual function to electrically isolate the micro-mirror 314 from the support portion 412 and to provide structural support between the mirror 314 and the support portion 412.

Insulator portion 418 is patterned in combination with the conductor 425 and is shown in a cross-section in FIG. 17-b to form a transversely extending rectangular annular frame comprised of integrally formed parallel lateral segments 418-a,b and 425-a,b. The segments 418-a,b and 425-a,b are formed in contact with the respective adjacent edges of mirror 314 and support portion 412. Insulator portion 418 and conductor 425 form segments 418-d,e and 425-d,e extending laterally beyond the lateral extent of micro-minor 314 and support portion 412 and provide resilient support for motion of the respective adjacent edge of micro-mirror 314 toward and away from the corresponding edge of support portion 412.

The insulator portion 418, that extends over the micro-mirror 314 and under conductor 425, comprises a feed through hole there through (not shown) which permits conductor 425 to make a first electrical connection with the micro-mirror 314. A second electrical connection to support portion 412 is made via flexure 324. Micro-mirror 314 and planar support 425 may, therefore, be electrically charged by application of a electric potential between conductor 425 and flexure 324. A suitable electric charge results in the formation of an electrostatic force between the micro-mirror 314 and the support portion 412. The electrostatic force causes the micro-mirror 314 to tilt in a direction shown as rotation 480, away or towards the support portion 412 and along an axis established by the insulator "hinge" portion 416.

The C-shaped bi-planar segments 418-d,e, 425-d,e are preferably resilient so as to provide a centering and restoring force to counteract the electrostatic force between micro-mirror 314 and support portion 412. For any given potential between micro-mirror 314 and support portion 412, the restoring force limits the angular displacement 480. The resulting rotation 480 of the micro-mirror 314 may be used to re-direct a laser beam impinging on the reflective surface 415 by several degrees relative to a normal to the plane of support portion 412.

Referring again to FIG. 16 and 17-a–b, the rotation of micro-mirror 314 about the axis of hinge portion 416 enables the reflected laser beam 191 to be directed out-of-the plane of the substrate 350 in a direction generally orthogonal to the rotation 370, thereby providing two degrees of adjustment to direct the outgoing laser beam 191 to a core of a desired PM optical fiber 102. By analogy to the above discussion those skilled in the art will recognize that the optical switch 104 may also function to direct the reflected laser beam 192 back to the laser-optics assembly 101.

Course and/or fine alignment signals representative of misalignment of outgoing laser beam 191 to the PM optical fiber 102 may be applied to move the micro-motor 321 and the micro-mirror 314 relative to the support portion so as to maintain fine alignment of the outgoing laser beam 191 to the core of the PM optical fibers 102. In an exemplary embodiment, course alignment signals may be obtained by using a look-up table of pre-calibrated values, while the fine alignment signals may be obtained by measuring an amplitude of the reflected laser beam 192. The alignment signals may applied as a closed loop feedback signal so as to maintain fine alignment.

Figure 18:
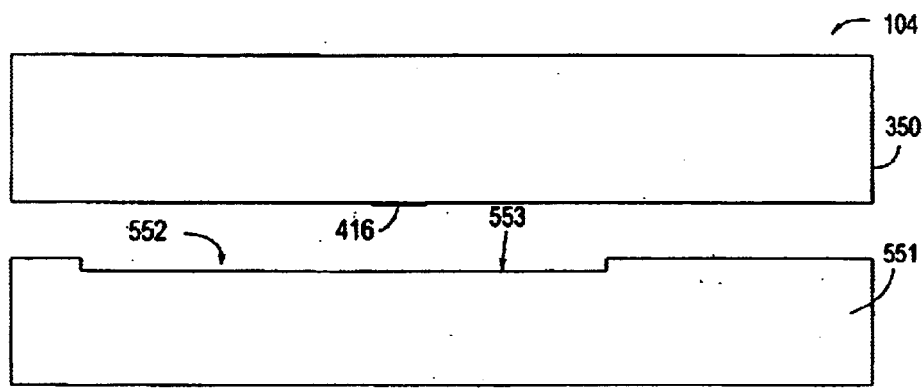
FIG. 18 illustrates a stage of fabrication of the fiber optic switch of FIG. 16.
Figure 19:
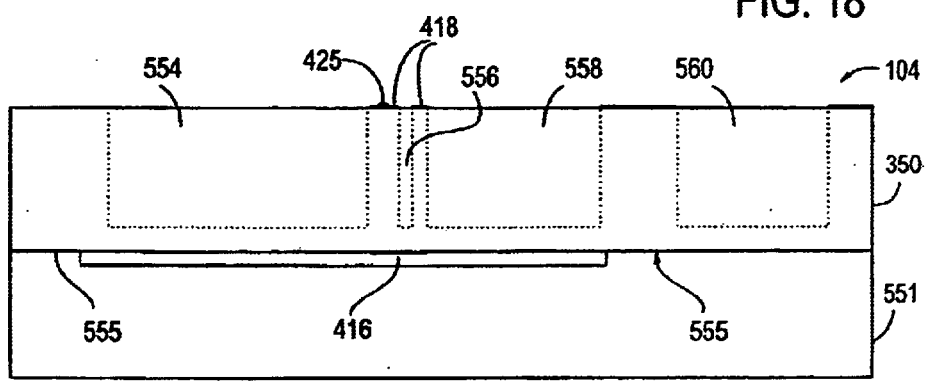
FIG. 19 illustrates a stage of fabrication of the optical switch of FIG. 16.
Figure 20:
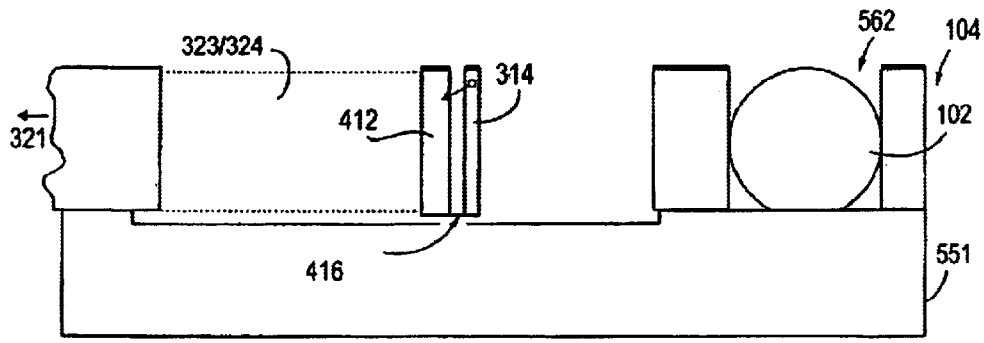
FIG. 20 illustrates a stage of fabrication of the optical switch of FIG. 16.

Referring now to FIGS. 18–20, a optical switch 104 is shown during various stages of fabrication. In a preferred embodiment, silicon bonding and Deep Reactive Ion Etching (DRIE) techniques are used to manufacture the microstructures comprising optical switch 104. The DRIE processing techniques enable high aspect ratio grooves, channels and other features to be reactively ion etched into silicon substrate 350. As described, the DRIE process is used to fabricate the optical fiber alignment structures, as well as optical deflection and guiding mechanisms. The DRIE process may be controlled to produce etched sidewalls that are smooth and substantially perpendicular to the substrate surface.

As discussed previously, the optical switch 104 includes micro-motor 321, flexures 323 and 324, mirror 314, support portion 412, conductor 425, insulator portions 416 and 418, and silicon substrate 350. The optical switch 104 further includes a lower silicon substrate 551. As a first step for manufacture, a shallow etched gap 552 is provided at a top surface of the lower silicon substrate 551. The gap 552 subsequently functions to provide a void for movement of the flexures 323 and 324, the micro-mirror 314, and the support portion 412. As a further step in manufacture, biplanar oxide layer 418 and overlaying metal layer 425 are formed on an outward surface of substrate 350. An oxide layer 416 is formed on an opposed inward face of the substrate 350. Oxide layer 553 is formed on a facing surface of substrate 551. Layer 553 is formed on a facing top surface of the bottom substrate 551 to subsequently provide a fusion bonding interface 555 between the two substrates 350 and 551.

Figures 17A, 17B:
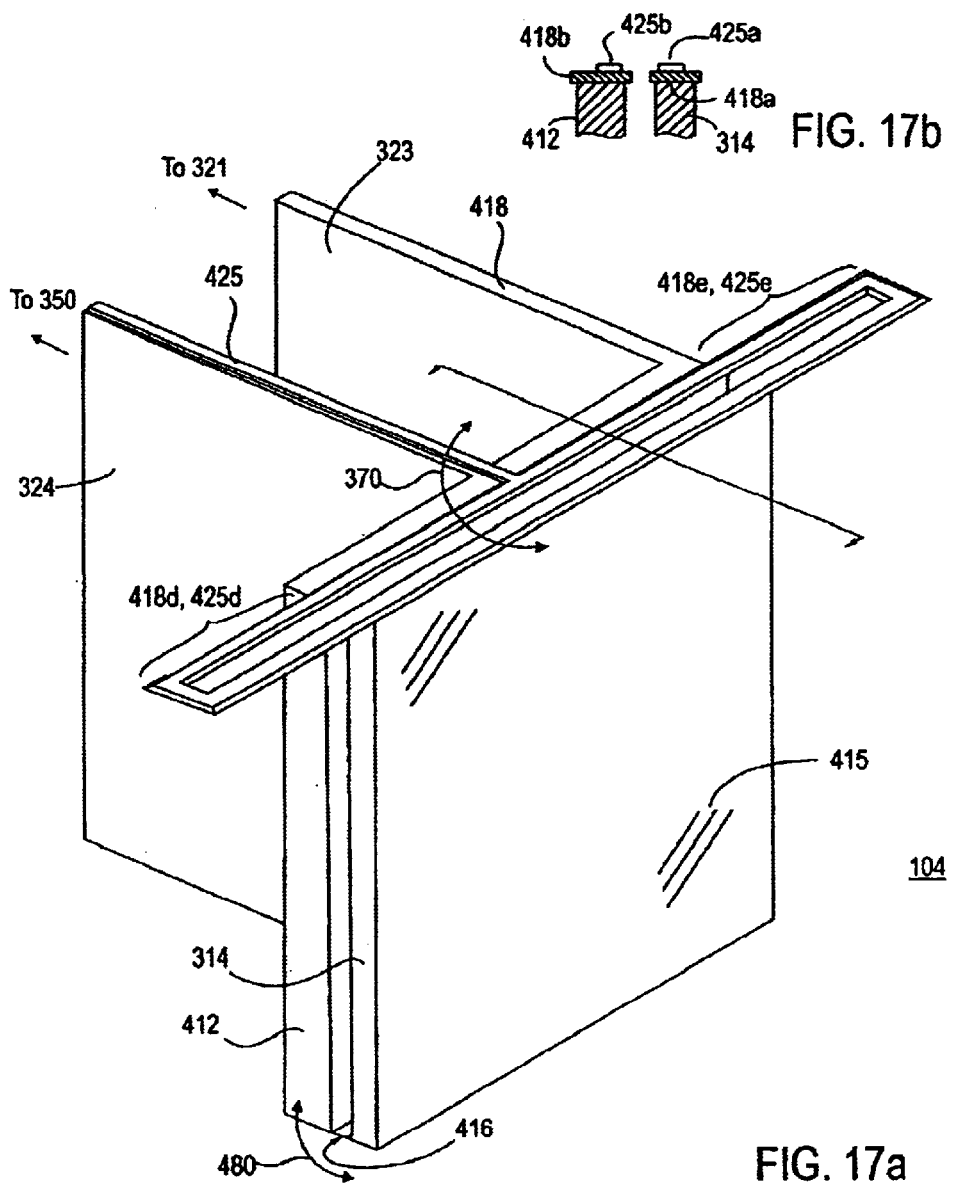
FIGS. 17-a–b illustrate the fiber optic switch of FIG. 16 in further detail.

Oxide layer 416 is patterned to subsequently provide the oxide hinge axis shown in FIG. 17a. After a step of bonding, facing surfaces of substrate 350 and substrate 551 are joined at fusion interface 555. A subsequent masking and DRIE step removes silicon from substrate 350 to form void regions 554, 556, 558 and 560 (shown as partially completed in FIG. 19) which define micro-mirror 314, support portion 412, and spaced apart planar flexures 324 and 323 (overlaying in this view). The oxide layer 553 at interface 555 functions to stop the DRIE etch step at the surface of substrate 551, creating an accurate depth for alignment of optical fibers to the other microstructures of the optical switch 104.

Additionally, patterned insulator and metal regions are provided on the top or outward facing surface of the upper substrate wafer 350. The silicon underneath these insulator and metal regions is preferably etched in a wet or plasma isotropic etch step to form the insulator 418 and conductor 425 portions. Slight adjustment to the DRIE parameters may be used to incorporate a small degree of lateral underetching to remove silicon underneath the narrow extended insulator and conductor regions (shown as flexible extensions 418-d,e and 425-d,e in FIG. 17a) while leaving the silicon generally intact underneath those portions of the oxide layer 418 that form the micro-mirror 314, the support portion 412, and flexures 323 and 324. At the same time the micro-mirror 314, the support portion 412, and flexures 323 and 324 are fabricated, fiber optic alignment guides may be DRIE etched into the substrate 350. The PM optical fiber 102 is positioned within a lithographically defined and etched guide 562 and preferably aligned to the other micro-mechanical structures of optical switch 104.

Although FIG. 20 shows the PM optical fiber 102 located within a particular DRIE etched alignment guide, the direction of etching chosen for fiber optic alignment guides may be selected to provide any number of geometrical relationships between the incoming laser beam 191 and the PM optical fibers 102 relative to the location of the micro-mirror 314. Micro-motor 321 may also be manufactured with a process that combines the silicon fusion bonding and DRIE techniques used by the present invention or with a number of other techniques well known in the art, for example, sacrificial etching of thin-film polysilicon layers.

As previously discussed, linear micro-motor 321 functions to adjust the focal point of an incoming beam of light that is in the plane of the substrate 350, and a tilting mechanism adjusts the focal point out of the plane of the substrate. Many other variations of this general design and fabrication concept may be implemented to provide the same functions and operations. For example, different dimensional relationships, optical fibers that are not PM optical fibers, use of an PM optical fiber rather than a free space optical path between the laser-optics assembly 102 and the optical switch 104, sources of light other than laser sources, different input and output fiber formats, greater or fewer than six optical fibers; different flexure, insulator, and metal line designs to effectively position the mirror in other planes relative to the plane of the substrate; different types of micro-motor technologies, including: electrostatic, electromagnetic, or thermal technologies; and various combinations of DRIE and conventional anisotropic etching to align the fibers and to create the mirror surfaces and micro-motor designs.

FIG. 21*a* is a diagram showing a magneto-optical data storage and retrieval system as part of a magneto-optical disk drive. In a preferred embodiment, the magneto-optical system 100 may comprise a compact high-speed and high-capacity MO disk drive 800 that includes an industry standard 5.25 inch half-height form factor (1.625 inch), at least six double-sided MO disks 107, and at least twelve flying MO heads 106. As discussed above, the flying MO heads 106 may be manufactured to include optical and magnetic elements that provide a very small mass and low profile high NA optical system so as to enable utilization of multiple MSR MO disks 107 at a very close spacing within the MO disk drive 800 and; therefore, to comprise a higher areal and volumetric and storage capacity than is permitted in an equivalent volume of the prior art. In the preferred embodiment, a spacing between each of the at least six MO disks 107 can be reduced to at least 0.182 inches.

In an alternative embodiment shown in FIG. 21*b*, the half-height form factor MO disk drive 800 may include a removable MO disk cartridge portion 810 and two fixed internal MO disks 107. By providing the removable MO disk cartridge portion 810, the fixed internal and removable combination permits external information to be efficiently delivered to the MO disk drive 800 for subsequent transfer to the internal MO disks 107. The copied information may, subsequently, be recorded back onto the removable MO disk cartridge portion 810 for distribution to other computer systems. In addition, the removable MO disk cartridge portion 810 allows for very convenient and high speed back-up storage of the internal MO spinning disks 107. The fixed internal and removable combination also permits storage of data files on the removable MO disk cartridge portion 810 and system files and software applications on the internal MO spinning disks 107. In another alternative embodiment (not shown) an MO disk drive 800 may include: any number (including zero) of internal MO disks 107 and/or any number of MO disks 107 within any number of removable MO disk cartridge portions 1510.

The present invention does not necessarily require use of rotary actuator arms, for example, linear actuator arms may be used. The low profile optical paths disclosed by the present invention may be used to convey, information to and from a storage location without requiring objective optics (e.g., using a tapered optical fiber or an optical fiber with a lens formed on an end); and/or reflective substrates (e.g., using a curved optical fiber to convey information along surfaces of the magneto-optical head 106); and/or quarter-wave plates, as in a system that effectuates compensation of PM optical fibers using dynamic phase compensation. Free space optical paths may also be used to deliver and receive laser light, for example, with a suitably aligned laser diode and detector mounted on the actuator arm or, alternatively, on the flying head itself.

The present invention will be illustrated in the following examples. All parameters employed in the examples are not to be interpreted to unduly limit the invention.

EXAMPLE 1

Referring again to FIG. 2, there is shown a view of an embodiment of a steerable micro-machined mirror assembly 400. Relevant geometrical features are indicated in the drawings. As previously stated, the central mirror plate portion 420 is supported by suspension hinges 410 which may be of a different thickness than the reflective central mirror portion 420 itself. Spaced apart actuation electrodes 402 and 403 are shown below the reflective central mirror portion 420 and separated from the reflective central mirror portion 420 by a gap, g. For purposes of analysis, a square wave excitation at electrodes 402 and 403 is assumed ($V_a$ and $V_b$) to rotate the reflective central mirror portion 420 around the y-axis by an angle, $\theta$.

The electrostatic force to actuate the torsional motion of the reflective central mirror portion 420 is balanced by the torsional restoring force provided by the suspension hinges 410. The stiffness of the suspension hinges 410 is given by the following expressions from *Roark's Formulas for Stress and Strain* ($6^{th}$ Edition, published by McGraw Hill Text, p. 347):

$$T = 2\frac{\theta}{l}\kappa G \qquad (1)$$

$$G = \frac{E}{2(1+v)} \qquad (2)$$

$$\kappa = wt_s^3\left[\frac{1}{3} - \frac{3.36}{16}\frac{t_s}{w}\left(1 - \frac{1}{12}\left(\frac{t_s}{w}\right)^4\right)\right] = wt_s^3\beta \qquad (3)$$

where $\theta$ is the twist at the end of the hinge 410 (radians), E and v are the Young's modulus and Poisson's ratio of the suspension material, l is the length of the suspension hinges 410, w is the hinge 410 width, and $t_s$ is the hinge 410 thickness. The factor of two on the right hand side of equation (1) accounts for the presence of the two torsional hinges 410 at either end of the reflective central mirror portion 420. Alternatively, the torque caused by the electrostatic attraction of the reflective central mirror portion 420 to the driving electrodes 402 and 403 may be expressed $$T = \int_0^{\frac{b}{2}} dF(x)x = \int_0^{\frac{b}{2}} \left(\frac{dF}{dx}\right)x\,dx \tag{4}$$

where dF(x) is the incremental attractive force acting on an infinitesimal element of width dx of the reflective central mirror portion 420, x is taken as the transverse distance from the central axis of the reflective central mirror portion 420 to the position of the incremental element, and the integration is performed over half of the width of the reflective central mirror portion 420. The incremental force dF(x) is a function of x because the angular deflection of the reflective central mirror portion 420 causes the separation between the electrode 402 (or 403) and the reflective central mirror portion 420 to vary linearly with position along the width of the reflective central mirror portion 420. Thus:

$$dF = \frac{1}{2}dC(x)\frac{V^2}{g - z(x)} \tag{5}$$

where dC(x) describes the incremental capacitance along the width of the reflective central mirror portion 420 due to the tilt of the reflective central mirror portion 420, V is the actuation voltage, g is the undeflected gap between the electrode 402 (or 403) and the reflective central mirror portion 420, and z(x) is the reflective central mirror portion 420 deflection caused by the electrostatic attraction. For the incremental strip of width "dx" and length "a", equation (5) can be revised to:

$$dF = \frac{1}{2}\varepsilon_0 a\left(\frac{V}{g - \theta x}\right)^2 dx \tag{6}$$

where $e_0$ is the permittivity of free space, and $\theta$ is the angular deflection of the edge of the reflective central mirror portion 420 using the small angle approximation. Substitution of equation (6) into equation (4) yields:

$$T = \frac{1}{2}\varepsilon_0 aV^2 \int_0^{\frac{b}{2}} \frac{x}{(g-\theta x)^2}dx = \frac{\varepsilon_0 aV^2}{2g^2}\int_0^{\frac{b}{2}} \frac{x}{\left(1 - \frac{\theta}{g}x\right)^2}dx \tag{7}$$

Solving for the integration gives the following:

$$T = \frac{\varepsilon_0 aV^2}{2\theta^2}\left[\ln\left(1 - \frac{b\theta}{2g}\right) + \frac{\frac{b\theta}{2g}}{1 - \frac{b\theta}{2g}}\right] \tag{8}$$

Substituting equations (1–3) into (8) and rearranging terms gives the following expression for actuation voltage as a function of the angular deflection:

$$V = \sqrt{\frac{2\theta^3 wt_s^3\beta E}{\varepsilon_0 al(1+v)\left(\ln\left(1-\frac{b\theta}{2g}\right) + \frac{\frac{b\theta}{2g}}{1-\frac{b\theta}{2g}}\right)}} \tag{9}$$

Equation (9) describes a function that peaks for a critical angle of the reflective central mirror portion 420 rotation. The electrostatic force varies as the inverse of the square of the separation distance between the reflective central mirror portion 420 and the actuator electrode 402 or 403, but the restoring force provided by the torsional hinges varies only linearly with the deflection angle. Beyond a critical angle, the electrostatic force overwhelms the restoring force, and the reflective central mirror portion 420 spontaneously deflects to the actuator electrode 402 or 403. Therefore, equation (9) is not valid for deflection angles greater than the critical angle. For desired angular deflections greater than the critical angle, an actuator voltage slightly greater than the value needed to cause the spontaneous deflection to the electrode 402 or 403 is preferable.

For its torsional mode, the resonant frequency in hz (f) of the reflective central mirror portion 420 is defined as:

$$f = \frac{1}{2\pi}\sqrt{2\frac{k}{I_m}} \tag{10}$$

where k is the torsional spring constant, $I_m$ is the reflective central mirror portion 420 mass moment of inertia, and the factor of two within the radical accounts for the presence of two torsional hinges 410. Equations (1–3) can be rearranged to show that k can be expressed as:

$$k = \frac{T}{\theta} = \frac{wt_s\beta E}{2l(1+v)} \tag{11}$$

and the mass moment of inertia is of the familiar form:

$$I_m = \int_{-\frac{b}{2}}^{\frac{b}{2}} at_m\rho x^2\,dx = \frac{1}{12}at_m\rho b^3 \tag{12}$$

where tm2 is the thickness of the reflective central mirror portion 420 and p is the mass density of the mirror material. It is assumed that the thickness of the reflective central mirror portion 420 is close to that of the hinge 410 so that the correction for the parallel axes theorem is negligible. Combining equations (10–12) yields the following expression for the resonant frequency:

$$f = \frac{1}{2\pi}\sqrt{\frac{12wt_s^3\beta E}{lat_m\rho b^3(1+v)}} \tag{13}$$

Figure 22:
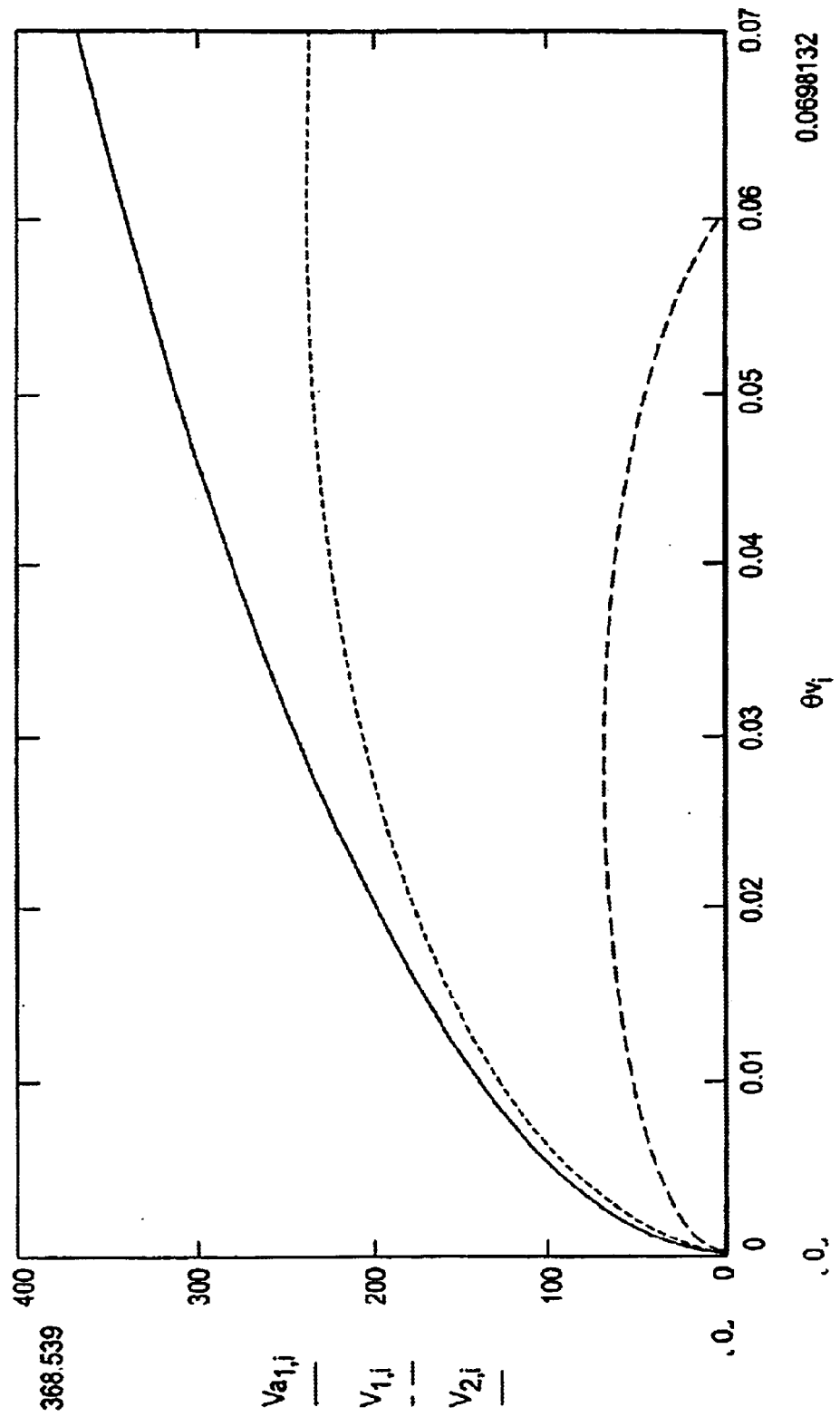
FIG. 22 is a graph depicting actuation voltage as a function of angular deflection for three embodiments of a steerable micro-machined mirror.

FIG. 22 shows the actuation voltage as a function of maximum deflection angle $\theta v_i$ (in radians, 2 degrees equals 0.035 radians) for the following two sets of geometrical parameters (dimensions are in microns, in both cases the reflective central mirror portion 420 and hinges 410 are preferably fabricated from silicon nitride which has a Young's modulus, E, of 385 Gpa and a Poisson's ratio, v, of 0.066). The calculated resonant frequency in both cases is 99 KHz.

|  | Set 1, $V_{1,i}$ | Set 2, $V_{2,i}$ |
|---|---|---|
| suspension width (w) | 10 | 10 |
| suspension length (l) | 300 | 300 |
| suspension thickness ($t_s$) | 3 | 3 |
| mirror width (b) | 100 | 100 |
| mirror length (a) | 400 | 400 |
| mirror thickness (tm2) | 2.2 | 2.2 |
| gap (g) | 7 | 3 |

The lowest of the three curves ($V_{2,i}$ in the graph of FIG. 22 describes the situation for the case of a narrow (3 micron) initial gap between the electrodes 402 and 403 and the reflective central mirror portion 420. Although the actuation voltage is small in this case (maximum voltage is 66.6 V), the nonlinear affect of the electrostatic force causes instability at an angle of about 1.55 degrees (0.027 radians), the point wherein the voltage curve reaches a maximum. Therefore, the mirror's angle beyond 1.55 degrees cannot be predicted with accuracy, and in fact, due to the shallow slope of the curve beyond about 0.01 radians (0.6 degrees), control of the actuation voltage would require precise control to obtain a desired certainty of angular deflection.

Alternatively, the wider gap (7 microns) assumed for the middle of the three curves ($V_{1,i}$) in the graph of FIG. 22 keeps the maximum necessary deflection of 0.035 radians within the stable region of the deflection of the reflective central mirror portion 420. The actuation voltage for 2 degrees deflection in this case is 215.7 V. However, the voltage that causes instability in this case is roughly 237 V; therefore, relatively good control of the voltage would be required to keep clear of the unstable region.

The upper curve, $Va_{1,i}$ of FIG. 22 uses the wider gap of 7 microns. When the quantity $b\theta/2$ g is small, the actuation voltage expression of equation (9) may be represented by a quadratic approximation. In this situation, we are also in the stable region of the voltage curve, as is, evident by the shapes of the top two curves. Under this approximation the following substitution can be made:

$$\left( \ln\left(1 - \frac{b\theta}{2g}\right) + \frac{\frac{b\theta}{2g}}{1 - \frac{b\theta}{2g}} \right) = \frac{1}{2}\left(\frac{b\theta}{2g}\right)^2 \quad (14)$$

and equation (9) reduces to:

$$V = \sqrt{\frac{16\theta w t_s^3 \beta E g^2}{\varepsilon_0 a l b^2 (1+v)}} \quad (15)$$

In order for this expression to be reasonably representative of equation (9), a lower bound is placed on the value of the gap, g, which for the geometries listed above is on the order of the 7 microns assumed for Set 1 above.

Equations (13) (resonant frequency) and (15) (actuation voltage) are rearranged and reproduced below. The approximation described in the previous section is used so that the tradeoffs between voltage and resonant frequency are more clearly evident.

$$f = \frac{1}{\pi}\sqrt{\frac{3}{bt_m\rho}}\sqrt{\frac{wt_s^3 \beta E}{lab^2(1+v)}} \quad (13)$$

$$V = 4g\sqrt{\frac{\theta}{\varepsilon_0}}\sqrt{\frac{wt_s^3 \beta E}{lab^2(1+v)}} \quad (15)$$

Comparison between these two expressions indicate that nearly all of the geometrical parameters involved drive the frequency and the voltage in the same direction. Therefore the need for a high bandwidth dictates a high actuation voltage. Some limited freedom to increase the bandwidth irrespective of the actuation voltage exists via the reflective central mirror portion 420 thickness and the material it is made from as well as, to a small extent, the width of the reflective central mirror portion 420. As mentioned previously, reducing the gap, g, much below the 7 microns will lead to instability in the reflective central mirror portion 420 for the larger angular deflections needed.

Combinations calculated actuation voltage and calculated frequency are listed below for several values of mirror plate width, mirror plate length, and gap (all other geometrical parameters are assumed to be the same as listed for Set 1 above). Gap distances are changed for these calculations because the choice of b dictates the minimum gap needed to ensure stability.

| b (microns) | g (microns) | a (microns) | f (KHz) | V (volts) |
|---|---|---|---|---|
| 50 | 3.50 | 400 | 280 | 216 |
| 50 | 3.50 | 2000 | 125 | 97 |
| 75 | 5.25 | 400 | 152 | 216 |
| 75 | 5.25 | 1000 | 96 | 136 |
| 100 | 7.00 | 400 | 99 | 216 |
| 125 | 8.75 | 400 | 71 | 216 |
| 150 | 10.50 | 400 | 54 | 216 |
| 175 | 12.25 | 400 | 43 | 216 |
| 200 | 14.00 | 400 | 35 | 216 |

The dynamic behavior of the steerable micro-machined mirror assembly 400 is described by the second order differential equation:

$$I_m\ddot{\theta} + f_\theta\dot{\theta} + k\theta = T \quad (16)$$

where $f_\theta$ represents the damping in the torsional oscillations and all the other parameters have been previously defined. An important damping mechanism is assumed to be due to a film of air (the squeeze film, not shown) between the reflective central mirror portion 420 and the electrodes 402, 403. As the reflective central mirror portion 420 rotates, the pressure in the squeeze film is increased above the electrode 402 or 403 where the reflective central mirror portion 420 tilts toward it. Conversely, the pressure is reduced at the opposite electrode as the mirror plate 402 tilts away from that electrode 402 or 403. The pressure gradient developed by the squeeze film provides a moment that resists the motion of reflective central mirror portion 420.

At low frequencies of excitation this squeeze film acts as a damper caused by airflow into and out of the region between the mirror and the electrodes. At higher frequencies, when the air can not move readily beneath the reflective central mirror portion 420 fast enough to keep up with the motion of the reflective central mirror portion 420, the squeeze film acts as a spring rather than a damper. In the aforementioned embodiment, calculations show that the damping effect dominates over the spring effect.

Solving for the pressure distribution in the squeeze film involves a complicated solution to the Reynold's equation governing fluid flow in the region between mirror and electrodes. The derivation is complex, therefore only the solution is provided below. Because the damping effect dominates, an electrical analogy may be drawn in which the damping consists of a resistor, R, described by $$R = \frac{4\pi^6 g^3}{192 a^3 b^3 \mu}\left(1 + \frac{4a^2}{b^2}\right) \quad (17)$$

where $\mu$ is the viscosity of air at room temperature (1.87e-5 Pa-sec). The damping coefficient then can be defined as $$\zeta = \frac{1}{2I_m R \omega_0} \quad (18)$$

where $\omega_0$ is the resonant frequency of equation (18) in radians/sec. The system response H(w) is then given by $$H(\omega) = \frac{\frac{1}{I_m}}{\omega_0^2 - \omega^2 + 2j\omega_0\zeta\omega} \quad (19)$$

Figure 23:
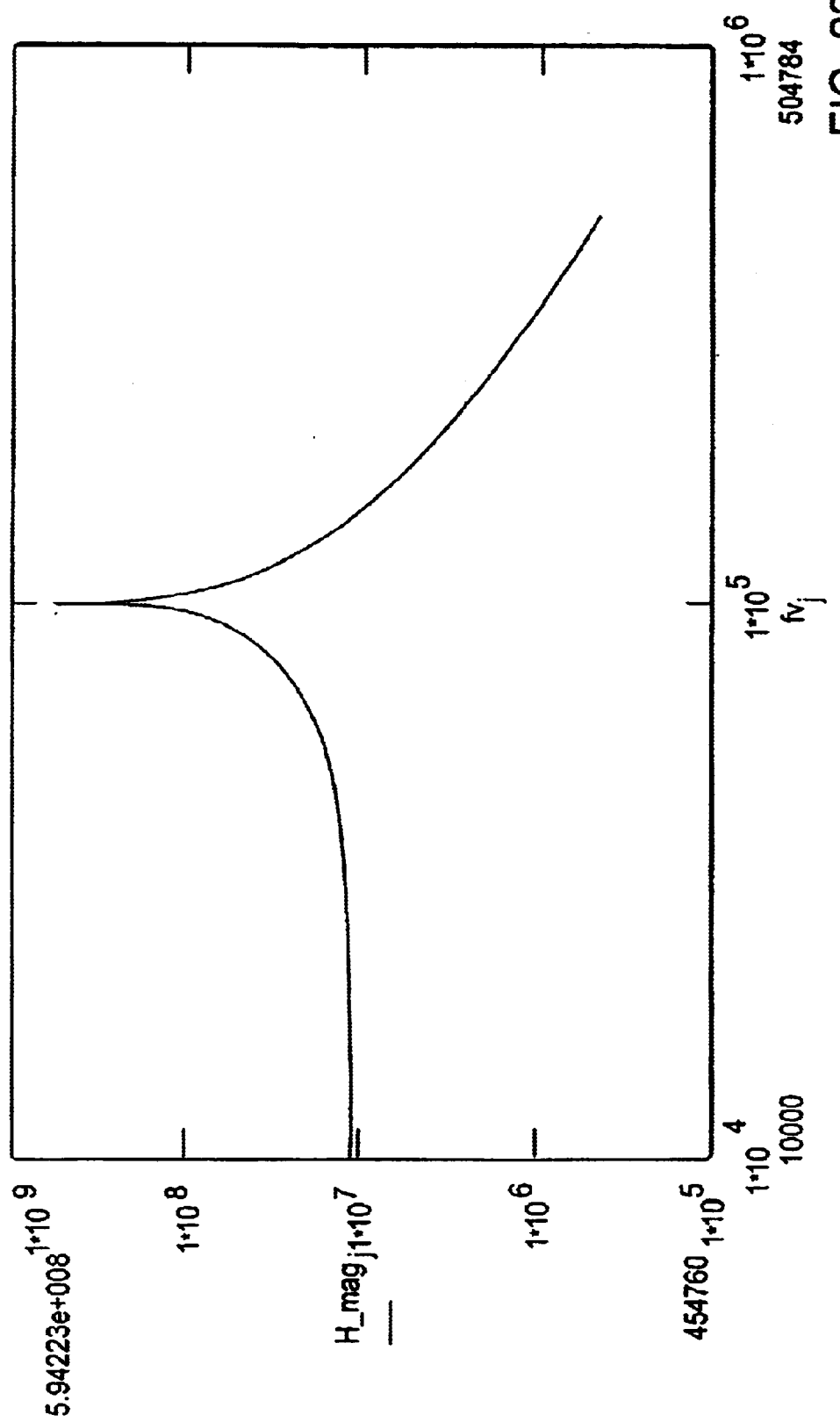
FIG. 23 is a graph of a frequency response for an embodiment of a steerable micro-machined mirror.
Figure 24:
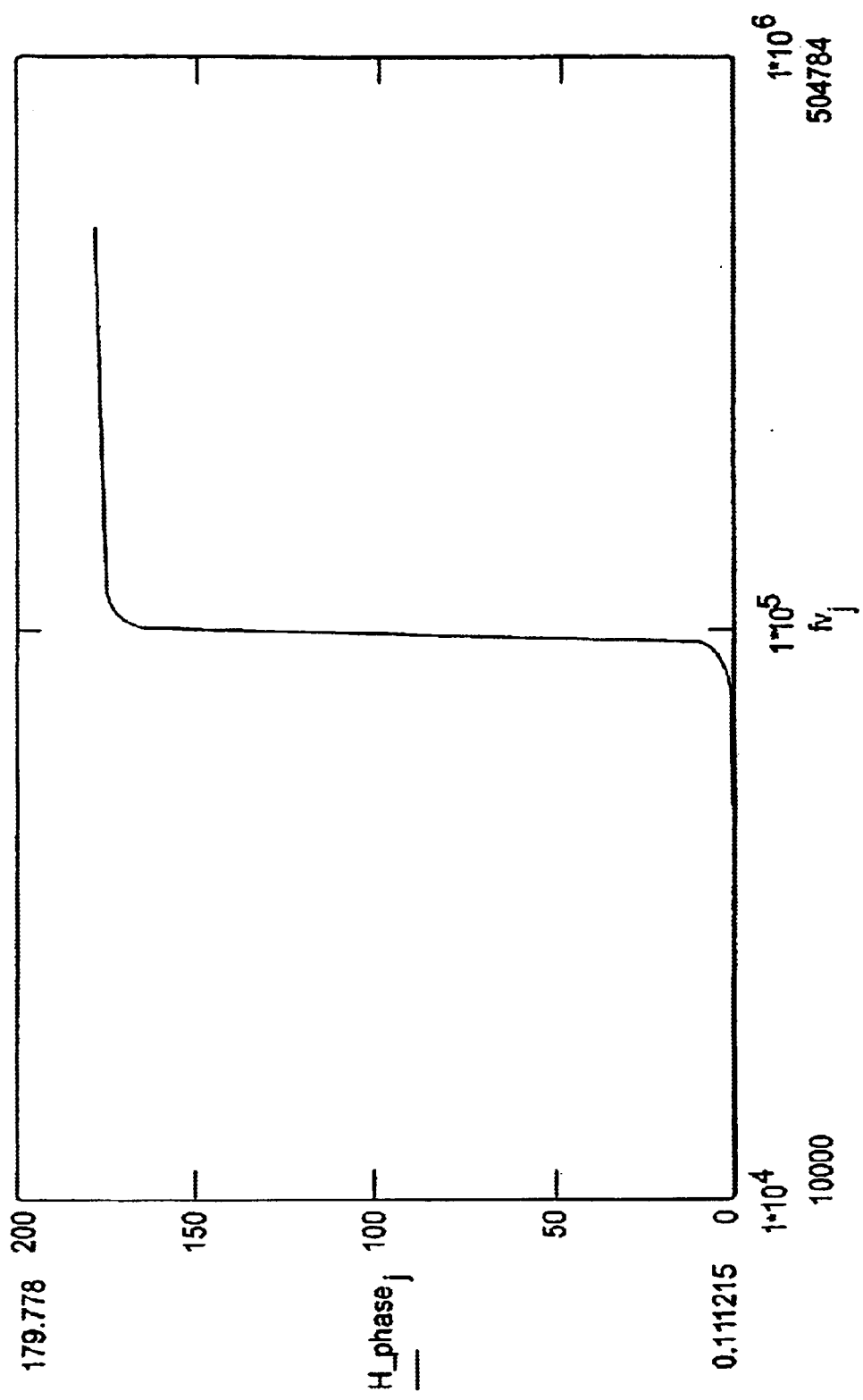
FIG. 24 is a graph depicting a phase response for an embodiment of a steerable micro-machined mirror.

For the parameters of Set 1 above, $\zeta=9.5e-3$, which implies a Q of 53. As computed, the system is underdamped, indicating that there would be much ringing in the step response. However, due to the fact that the initial assumption that the excursion of the reflective central mirror portion 420 be small with respect to g has been violated, it is likely that the damping will be larger than is indicated here. The frequency response for this calculation is presented in FIGS. 23 and 24.

EXAMPLE 2

Use of the steerable micro-machined mirror assembly 400 at a desired actuation voltage of 100 V and with a bandwidth of 100 KHz requires a number of tradeoffs. Presented below are modeling results of two sets (i.e., Sets 3 and 4) of geometrical parameters for the reflective central mirror portion 420 where one set (i.e., Set 4) is more optimal for actuation voltage, with a preferred actuation voltage 100 V, and the other set (i.e. Set 3) is better for bandwidth, with a preferred resonant frequency (KHz) being 100 KHz. The relevant mathematical analysis for the mirror performance is presented in Example 1 above. The geometrical dimensions are in microns.

|  | Set 3, $V_{3,i}$ | Set 4, $V_{4,i}$ |
|---|---|---|
| suspension width (w) | 5 | 5 |
| suspension length (l) | 25 | 25 |
| suspension thickness ($t_s$) | 2 | 2 |
| mirror width (b) | 160 | 400 |
| mirror length (a) | 200 | 200 |
| mirror thickness (tm2) | 2 | 2 |
| gap (g) | 6 | 14 |
| calculated resonant frequency (KHz) | 92.9 | 23.5 |
| maximum voltage (V) | 169 | 152 |

Figure 25:
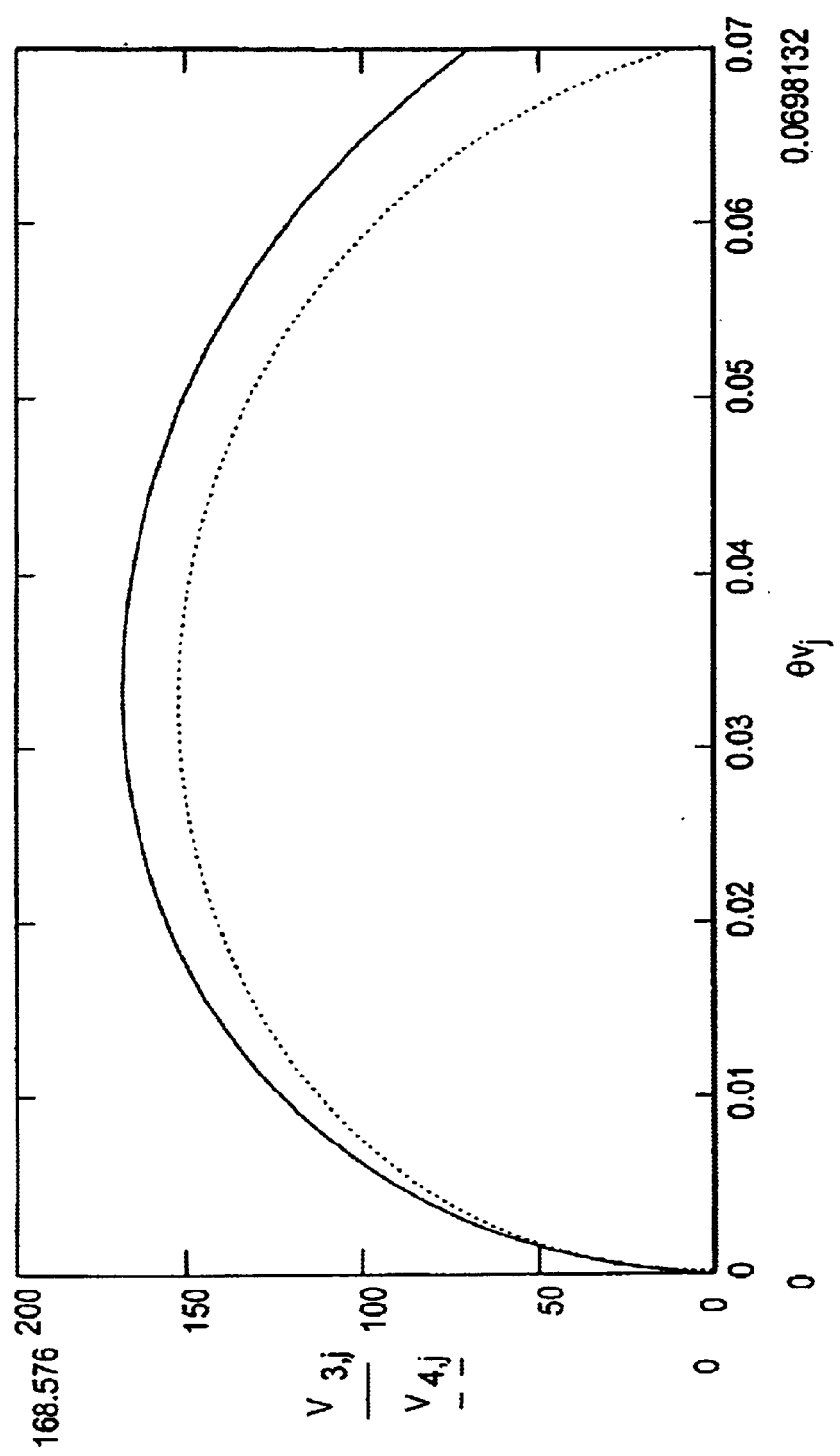
FIG. 25 is a graph depicting actuation voltage as a function of angular deflection for two embodiments of a steerable micro-machined mirror.
Figure 26:
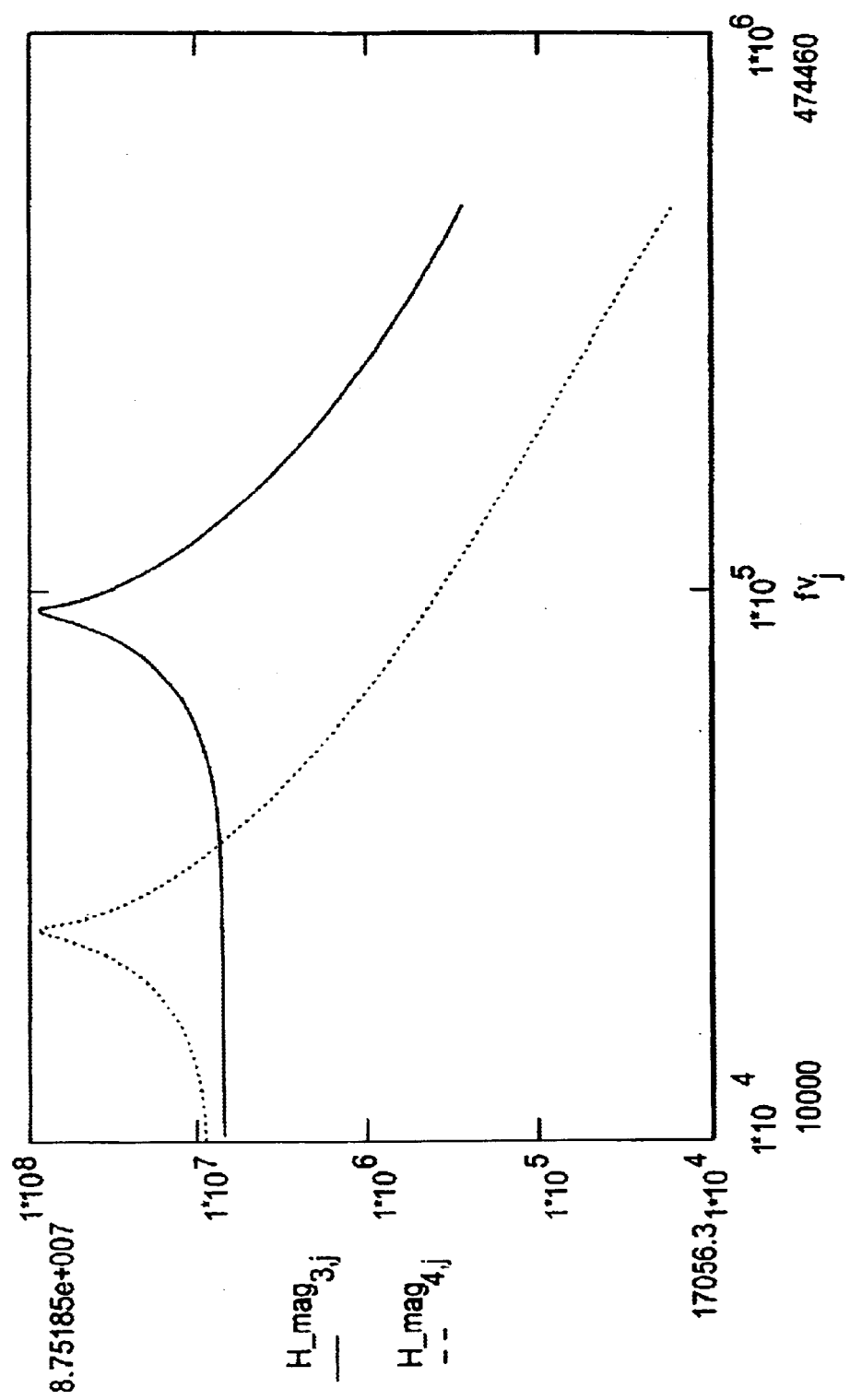
FIG. 26 is a graph depicting the frequency response for two embodiments of a steerable micro-machined mirror.
Figure 27:
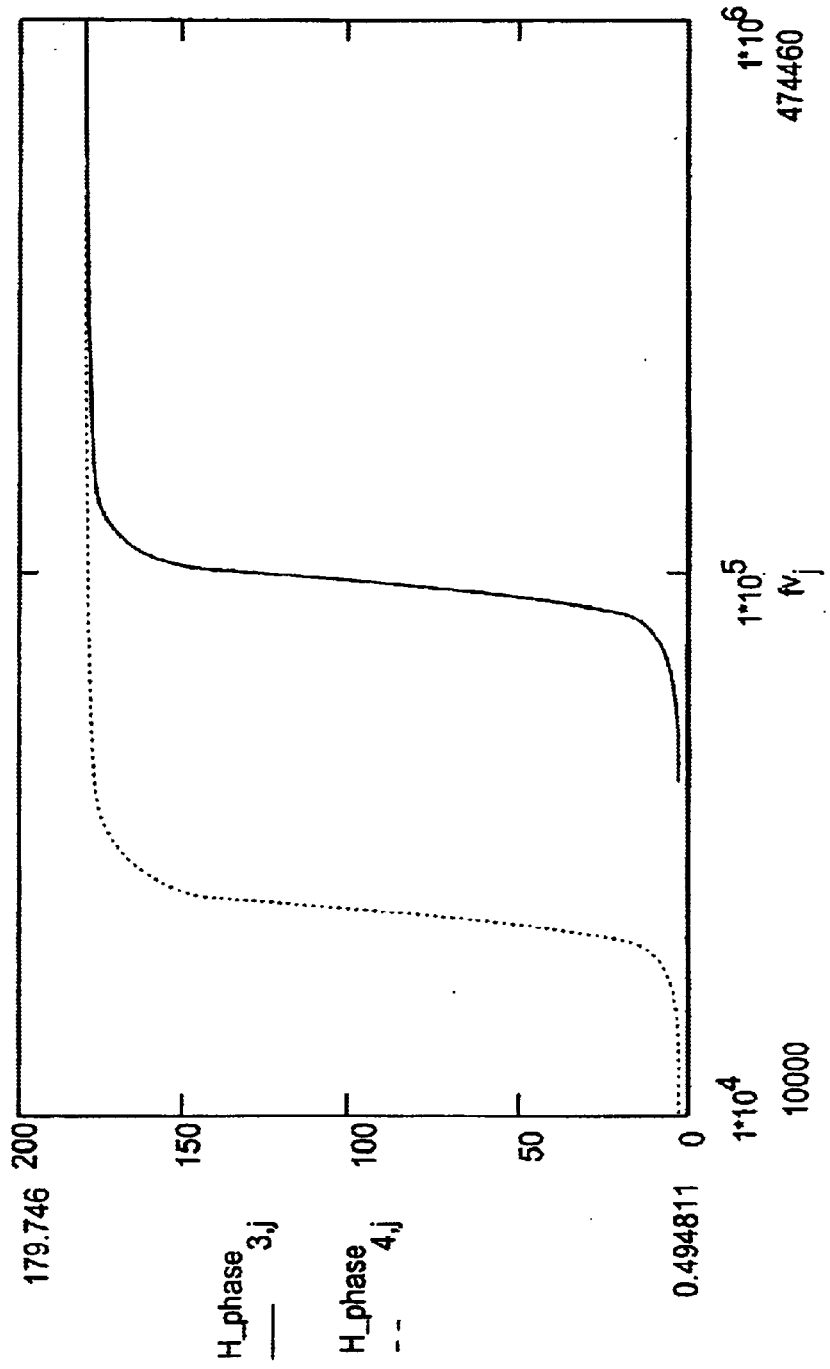
FIG. 27 is a graph depicting the phase response for two embodiments of a steerable micro-machined mirror.

The graphs in FIG. 25 depict the actuation voltage for set 3 and 4 as a function of angular deflection. Calculated frequency responses for the two design possibilities of Sets 3 and 4, using the expressions from the previous analysis in Example 1 above, are shown in FIGS. 26 and 27.

EXAMPLE 3

Non-linearity in the actuation voltage vs. angular deflection relationship for the steerable micro-machined mirror assembly 400 is an important concern for the positional control of the reflective central mirror portion 420. An effective way of dealing with this non-linearity is to increase the static gap between the electrodes 402 and 403 so as to stay clear of the point of electrostatic pull-in at the cost of requiring higher actuation voltage to get to the full +/−2 degrees of angular deflection.

Figure 28:
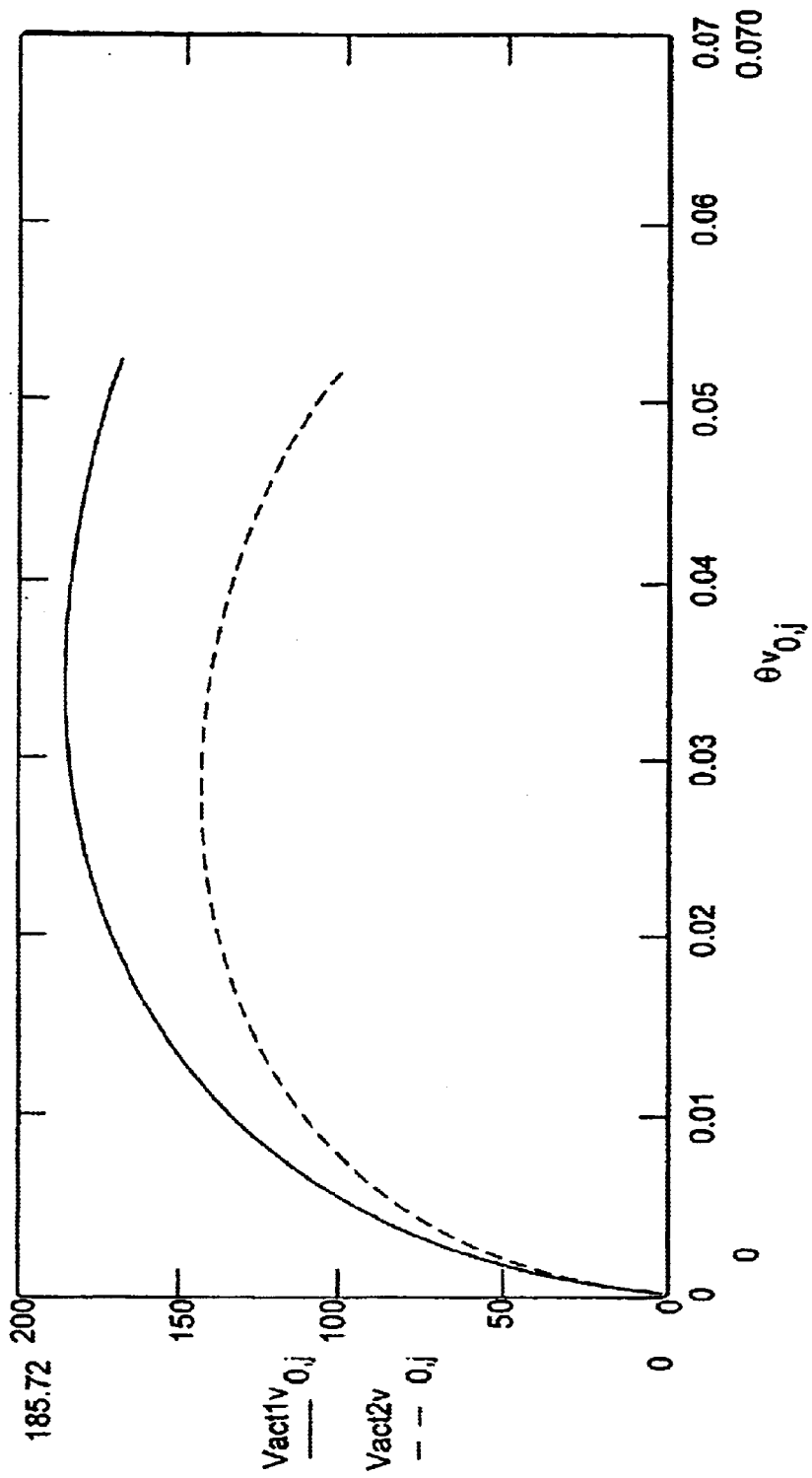
FIG. 28 is a graph depicting actuation voltage as a function of an angular deflection for two embodiments of a steerable micro-machined mirror.
Figure 29:
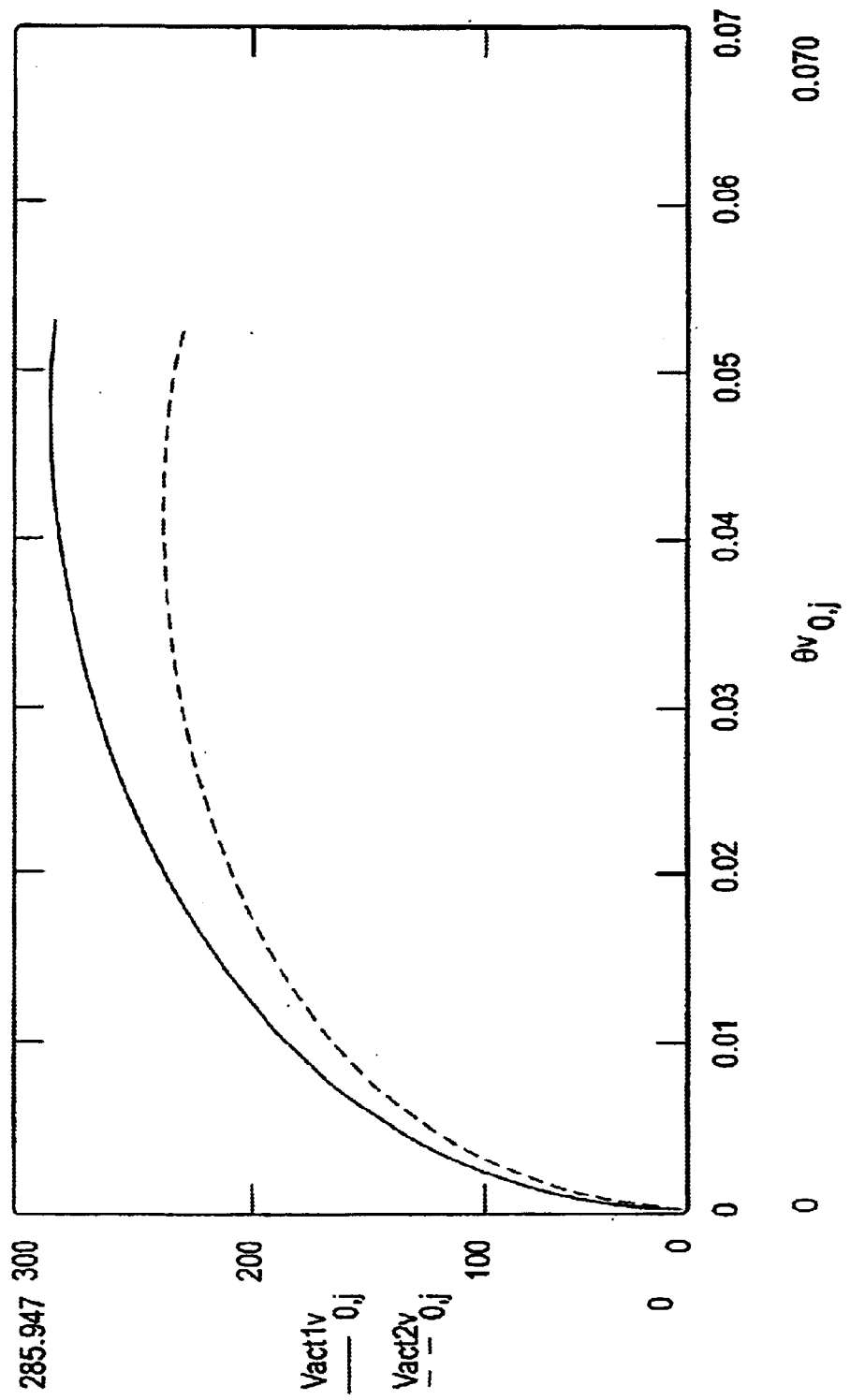
FIG. 29 is a graph depicting actuation voltage as a function of an angular deflection for two embodiments of a steerable micro-machined mirror.
Figure 30:
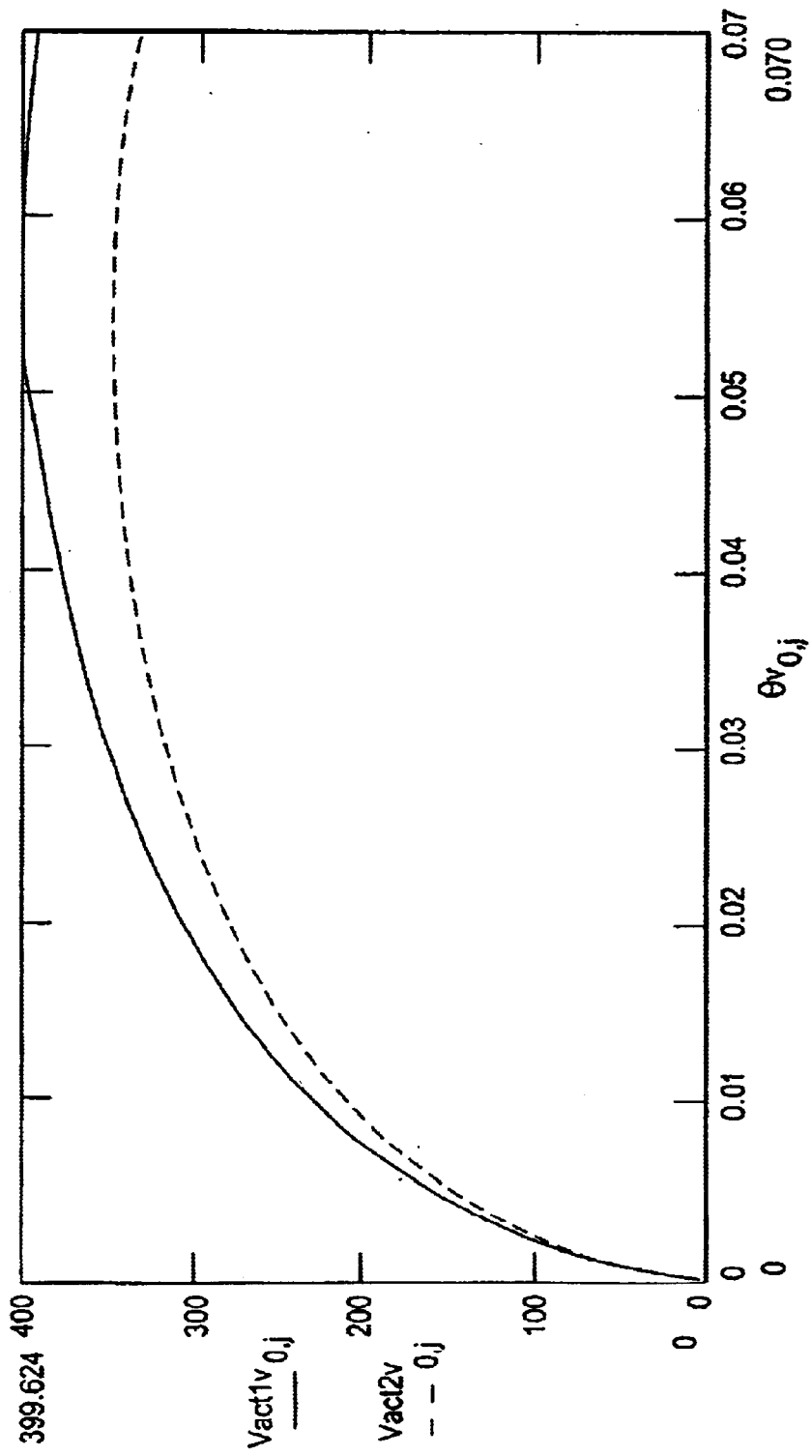
FIG. 30 is a graph depicting actuation voltage as a function of an angular deflection for two embodiments of a steerable micro-machined mirror.

For the graphs shown in FIGS. 28, 29, and 30 the geometrical parameters of the reflective central mirror portion 420 listed below are assumed with geometrical dimensions being in microns:

| suspension width (w) | 5 |
|---|---|
| suspension length (l) | 25 |
| suspension thickness ($t_s$) | 2 |
| mirror width (b) | 150 |
| mirror length (a) | 200 |
| mirror thickness (tm2) | 2 |
| calculated resonant frequency (KHz) | 102.3 |

Using these geometrical parameters, the actuation voltage vs. angular deflection relationships are shown for three different static gap widths (6, 8 and 10 microns). The gap width is the entire electrode spacing, including the thickness of the reflective central mirror portion 420. Two curves are plotted on each graph with the lower curve taking into account:the presence of the higher dielectric constant provided by the (nitride) reflective central mirror portion 420 and the upper curve neglecting this issue. Both curves are provided in order to indicate the approximate range expected for actuation voltages. The x-axis is plotted in radians with 0.035 radians equal to 2 degrees.

The performance of the structure with the 6 micron gap (see FIG. 28) operates on the brink of electrostatic pull-in for the full 2 degrees of deflection. FIGS. 29 and 30 show some improvement for 8 and 10 microns, respectively but at the penalty of an increase in actuation voltage up to nearly 400 volts in the case of the 10 micron gap. Therefore, for improved linearity, the steerable micro-machined mirror assembly 400 preferably has a static gap on the order of 8–10 microns.

EXAMPLE 4

To present the concept of a variable gap width as shown in FIG. 5 analytically, a calculation of voltage as a function of angular deflection follows the same approach as presented in example 2. It is assumed that the transition between these two steps (i.e., between electrode surfaces 403b and 403a and between electrode surfaces 402b and 402a as shown in FIG. 5) occurs at the midpoint of the half width of the reflective central mirror portion 420 (x=+/−b/4). It is also assumed that the tethers 50 are not present for the design analyzed in this calculation. The original calculation using a constant gap width had the following $$V = \sqrt{\frac{2\theta^3 w t_s^3 \beta E}{\varepsilon_0 a l (1+v) \left( \ln\left(1 - \frac{b\theta}{2g}\right) + \frac{\frac{b\theta}{2g}}{1 - \frac{b\theta}{2g}} \right)}} \quad (1)$$

where the geometrical parameters are shown in the two figures (FIGS. 4 and 5), $\beta$ is a dimensionless parameter that depends on the hinge thickness and width, E and v are the Young's modulus and Poisson's ratio for the hinge material, and $e_0$ is the permittivity of free space. Incorporating the two-step variable gap into this calculation involves a simple adjustment to the integration of the torque as a function of x. The result is as follows:

$$V = \sqrt{\frac{2\theta^3 w t_s^3 \beta E}{\varepsilon_0 a l(1+v)\left(\left[\ln\left(1-\frac{b\theta}{4g_a}\right)+\frac{\frac{b\theta}{4g_a}}{1-\frac{b\theta}{4g_a}}\right]+\ln\left[\frac{1-\frac{b\theta}{2g_b}}{1-\frac{b\theta}{4g_b}}\right]+\frac{1}{1-\frac{b\theta}{2g_b}}-\frac{1}{1-\frac{b\theta}{4g_b}}\right)}} \quad (2)$$

which reduces to equation (1) when $g_a = g_b = g$

Figure 31:
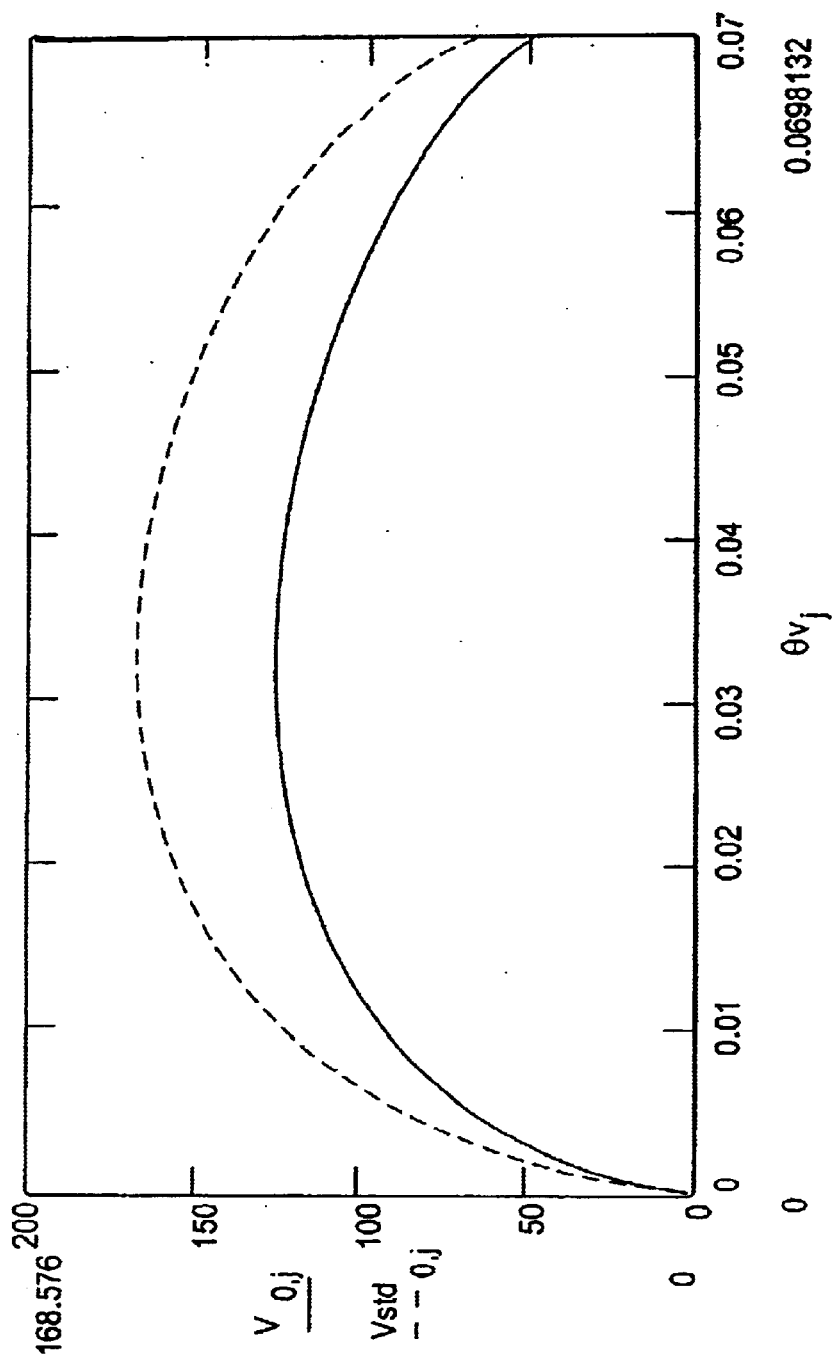
FIG. 31 is a graph depicting actuation voltage as a function of angular deflection for an embodiment of a steerable micro-machined mirror.

FIG. 31 shows voltage vs. angular deflection and the reduction in actuation that is provided by this design modification given the geometrical choices defined in the table below. The upper curve of the graph indicates the actuation voltage curve for the uniform gap of 6 microns; the lower curve has the gap from x=b/4 to x=b/2 also at 6 microns but a reduced gap of 3 microns exists for x=0 to x=b/4. Although the point of instability has not changed, the maximum voltage for the variable gap case has been reduced from 169 volts to 125 volts.

| | |
|---|---|
| suspension width (w) | 5 |
| suspension length (l) | 25 |
| suspension thickness ($t_s$) | 2 |
| mirror width (b) | 160 |
| mirror length (a) | 200 |
| mirror thickness (tm2) | 2 |
| gap (g) | 6 |
| calculated resonant frequency (KHz) | 92.9 |

Conclusion

While use of micro-machined elements have been described in an MO disk drive, those skilled in the art will recognize that use of micro-machined elements such as micro-mirrors and micro-actuators is applicable to information transfer using other technologies, including compact disks (CDs), digital video disks (DVD), and communication systems. Therefore, while the present invention has been described herein with reference to particular embodiments thereof, a latitude of modification, various changes and substitutions are intended in the foregoing disclosure, and it will be appreciated that in some instances some features of the invention will be employed without a corresponding use of other features without department from the scope of the invention as set forth.

We claim:

1. An apparatus for use with an optical disk comprising:
   (a) an arm substantially parallel to a surface of the disk and connected to pivot about an axis located at one end of the arm, the arm configured to approximately position an optical drive head located near another end of the arm over a selected portion of the disk;
   (b) a light source mounted near said one end of the arm configured to generate a beam of light in a plane substantially parallel to a surface of the disk; and
   (c) a steerable mirror assembly mounted near said another end of the arm configured to position a mirror to reflect the beam in a plane substantially perpendicular to the surface of the disk and toward the selected portion of the disk.

2. The apparatus of claim 1 wherein the steerable mirror assembly comprises a steerable micro-machined mirror assembly.

3. An apparatus for use with an optical disk comprising:
   (a) an arm substantially parallel to a surface the disk and connected to pivot about an axis located at one end of the arm, the arm configured to approximately position an optical drive head located near another end of the arm over a selected portion of the disk;
   (b) a light source;
   (c) an optical fiber mounted to the arm configured to transmit a beam of light from said light source; and
   (d) a steerable mirror assembly mounted near said another end of the arm configured to position a mirror to receive the beam of light and direct the beam to the selected portion of the disk.

4. The apparatus of claim 3 wherein the beam transmitted by the optical fiber is in a plane substantially parallel to a surface of the disk.

5. The apparatus of claim 3 wherein the beam directed from the mirror to the selected portion of the disk is in a plane substantially perpendicular to a surface of the disk.

6. The apparatus of claim 3 further comprising an imaging lens located between the optical fiber and the mirror.

7. A method for use with an optical disk drive having an arm substantially parallel to a surface of the disk and connected to pivot about an axis located at one end of the arm, the arm configured to approximately position an optical drive head located near another end of the arm over a selected portion of a disk, said method comprising the steps of:
   (a) transmitting a beam of light from an optical fiber mounted to the arm and
   (b) directing a steerable mirror assembly mounted near said another end of the arm to position a mirror to direct the beam to the selected portion of the disk.

8. The method of claim 7 wherein the transmitting includes transmitting the beam in a plane substantially perpendicular to a surface of the disk.

9. An apparatus for use with an optical disk comprising:
   (a) an arm substantially parallel to a surface of the disk and connected to pivot about an axis located at one end of the arm, the arm configured to approximately position an optical drive head located near another end of the arm over a selected portion of the disk;
   (b) an optical fiber mounted near said one end of the arm configured to transmit a beam of light in a plane substantially parallel to a surface of the disk; and
   (c) a steerable mirror assembly mounted near said another end of the arm configured to position a mirror to reflect the beam in a plane substantially perpendicular to the surface of the disk and toward the selected portion of the disk.

10. The apparatus of claim 9 wherein the steerable mirror assembly includes electrodes to steer the mirror.

11. The method of claim 7 wherein the steerable mirror assembly comprises a steerable micro-machined mirror assembly.

12. The apparatus of claim 9 wherein the steerable mirror assembly comprises a steerable micro-machined mirror assembly.

13. The apparatus of claim 3 wherein the light source comprises a laser optics assembly.

14. The method of claim 7 wherein the transmitting includes transmitting the beam in a plane substantially parallel to a surface of the disk.

15. The apparatus of claim 3 wherein the steerable mirror assembly comprises a steerable micro-machined mirror assembly.

16. The method of claim 14 wherein the steerable mirror assembly includes electrodes to steer the mirror.

17. An apparatus for use with an optical disk comprising:
   (a) an arm substantially parallel to a surface of the disk and connected to pivot about an axis located at one end of the arm, the arm configured to approximately position an optical drive head located near another end of the arm over a selected portion of the disk;
   (b) a light source mounted near said one end of the arm configured to generate a beam of light in a plane substantially parallel to a surface of the disk; and
   (c) a steerable mirror assembly means mounted near said another end of the arm configured for positioning a mirror to reflect the beam in a plane substantially perpendicular to the surface of the disk and toward the selected portion of the disk.

18. The apparatus of claim 17 wherein the steerable mirror assembly means comprises a steerable micro-machined mirror assembly means.

19. An apparatus for use with an optical disk comprising:
   (a) an arm substantially parallel to a surface the disk and connected to pivot about an axis located at one end of the arm, the arm configured to approximately position an optical drive head located near another end of the arm over a selected portion of the disk;
   (b) a light source;
   (c) an optical fiber mounted to the arm configured to transmit a beam of light from said light source; and
   (d) a steerable mirror assembly means mounted near said another end of the arm configured for positioning a mirror to receive the beam of light and direct the beam to the selected portion of the disk.

20. The apparatus of claim 19 wherein the beam transmitted by the optical fiber is in a plane substantially parallel to a surface of the disk.

21. The apparatus of claim 19 wherein the beam directed from the mirror to the selected portion of the disk is in a plane substantially perpendicular to a surface of the disk.

22. The apparatus of claim 19 further comprising an imaging lens located between the optical fiber and the mirror.

23. A method for use with an optical disk drive having an arm substantially parallel to a surface of the disk and connected to pivot about an axis located at one end of the arm, the arm configured to approximately position an optical drive head located near another end of the arm over a selected portion of a disk, said method comprising the steps of:
   (a) transmitting a beam of light from an optical fiber mounted to the arm and
   (b) directing a steerable mirror assembly means mounted near said another end of the arm for positioning a mirror to direct the beam to the selected portion of the disk.

24. The method of claim 23 wherein the transmitting includes transmitting the beam in a plane substantially perpendicular to a surface of the disk.

25. An apparatus for use with an optical disk comprising:
   (a) an arm substantially parallel to a surface of the disk and connected to pivot about an axis located at one end of the arm, the arm configured to approximately position an optical drive head located near another end of the arm over a selected portion of the disk;
   (b) an optical fiber mounted near said one end of the arm configured to transmit a beam of light in a plane substantially parallel to a surface of the disk; and
   (c) a steerable mirror assembly means mounted near said another end of the arm configured for positioning a mirror to reflect the beam in a plane substantially perpendicular to the surface of the disk and toward the selected portion of the disk.

26. The apparatus of claim 25 wherein the steerable mirror assembly means includes electrodes to steer the mirror.

27. The method of claim 23 wherein the steerable mirror assembly means comprises a steerable micro-machined mirror assembly means.

28. The apparatus of claim 25 wherein the steerable mirror assembly means comprises a steerable micro-machined mirror assembly means.

29. The apparatus of claim 19 wherein the light source comprises a laser optics assembly.

30. The method of claim 23 wherein the transmitting includes transmitting the beam in a plane substantially parallel to a surface of the disk.

31. The apparatus of claim 19 wherein the steerable mirror assembly means comprises a steerable micro-machined mirror assembly means.

32. The method of claim 30 wherein the steerable mirror assembly means includes electrodes to steer the mirror.

* * * * *